(12) United States Patent
Yazaki et al.

(10) Patent No.: US 10,861,757 B2
(45) Date of Patent: Dec. 8, 2020

(54) ELECTRONIC COMPONENT WITH SHIELD PLATE AND SHIELD PLATE OF ELECTRONIC COMPONENT

(71) Applicant: Murata Manufacturing Co., Ltd., Nagaokakyo (JP)

(72) Inventors: Hirokazu Yazaki, Nagaokakyo (JP); Tomoyoshi Hiei, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/538,948

(22) Filed: Aug. 13, 2019

(65) Prior Publication Data

US 2019/0363030 A1 Nov. 28, 2019

Related U.S. Application Data

(63) Continuation of application No. PCT/JP2018/003964, filed on Feb. 6, 2018.

(30) Foreign Application Priority Data

Feb. 23, 2017 (JP) ................................ 2017-031951
Jul. 18, 2017 (JP) ................................ 2017-138899

(51) Int. Cl.
*H01L 23/15* (2006.01)
*B32B 9/00* (2006.01)
(Continued)

(52) U.S. Cl.
CPC ............. *H01L 23/15* (2013.01); *B32B 9/005* (2013.01); *B32B 9/045* (2013.01); *B32B 38/04* (2013.01);
(Continued)

(58) Field of Classification Search
CPC ........ H01L 23/552–556; H05K 9/0073; H05K 9/0075; H05K 2201/0707;
(Continued)

(56) References Cited

U.S. PATENT DOCUMENTS

| 2005/0045358 A1* | 3/2005 | Arnold | H05K 9/0024 |
| | | | 174/51 |
| 2007/0221399 A1* | 9/2007 | Nishizawa | H01L 21/4807 |
| | | | 174/250 |
| 2014/0017486 A1* | 1/2014 | Yoo | B32B 27/36 |
| | | | 428/325 |

FOREIGN PATENT DOCUMENTS

JP 1-146393 A 6/1989
JP 7-193386 A 7/1995
(Continued)

OTHER PUBLICATIONS

Official Communication issued in Japanese Patent Application No. 2019-501193, dated Sep. 3, 2019.
(Continued)

*Primary Examiner* — Syed I Gheyas
(74) *Attorney, Agent, or Firm* — Keating & Bennett, LLP

(57) ABSTRACT

An electronic component includes a wiring substrate, surface mount devices mounted on a front surface of the wiring substrate, and a shield plate fixed on a side adjacent to top surfaces of the surface mount devices. The shield plate includes a magnetic ceramic sintered sheet and a first metal film. The magnetic ceramic sintered sheet includes a first main surface and a second main surface. The first metal film is disposed on the first main surface of the magnetic ceramic sintered sheet.

20 Claims, 12 Drawing Sheets

(51) Int. Cl.
*B32B 9/04* (2006.01)
*B32B 38/04* (2006.01)
*H01L 23/29* (2006.01)
*H01L 23/00* (2006.01)
*H01L 25/16* (2006.01)
*H05K 1/02* (2006.01)
*H05K 1/03* (2006.01)
*H05K 3/28* (2006.01)
*H05K 9/00* (2006.01)

(52) U.S. Cl.
CPC .............. *H01L 23/29* (2013.01); *H01L 24/48* (2013.01); *H01L 24/83* (2013.01); *H01L 25/165* (2013.01); *H05K 1/0216* (2013.01); *H05K 1/0306* (2013.01); *H05K 3/284* (2013.01); *H05K 9/0039* (2013.01); *H05K 9/0075* (2013.01); *B32B 2038/045* (2013.01); *B32B 2307/212* (2013.01); *H01L 2224/48247* (2013.01); *H05K 2201/0707* (2013.01)

(58) Field of Classification Search
CPC ... H05K 2201/10–10992; H05K 3/284; H05K 1/185; B32B 2307/212
See application file for complete search history.

(56) References Cited

FOREIGN PATENT DOCUMENTS

| | | | | |
|---|---|---|---|---|
| JP | 07193386 A | * | 7/1995 | |
| JP | 2005-26622 A | | 1/2005 | |
| JP | 2008-296431 A | | 12/2008 | |
| JP | 2008296431 A | * | 12/2008 | ............ B32B 18/00 |
| JP | 2011-14879 A | | 1/2011 | |
| JP | 2013-26234 A | | 2/2013 | |
| JP | 2014-19163 A | | 2/2014 | |
| JP | 2015-2245 A | | 1/2015 | |
| KR | 10-2013-0058292 A | | 6/2013 | |
| WO | 2016/067615 A1 | | 5/2016 | |
| WO | WO-2016067615 A1 | * | 5/2016 | ............ C04D 41/91 |

OTHER PUBLICATIONS

Official Communication issued in International Patent Application No. PCT/JP2018/003964, dated Apr. 17, 2018.

* cited by examiner

ELECTRONIC COMPONENT WITH SHIELD PLATE AND SHIELD PLATE OF ELECTRONIC COMPONENT

CROSS REFERENCE TO RELATED APPLICATIONS

This application claims the benefit of priority to Japanese Patent Application No. 2017-031951 filed Feb. 23, 2017 and Japanese Patent Application No. 2017-138899 filed on Jul. 18, 2017, and is a Continuation Application of PCT Application No. PCT/JP2018/003964 filed on Feb. 6, 2018. The entire contents of each application are hereby incorporated herein by reference.

BACKGROUND OF THE INVENTION

1. Field of the Invention

The present invention relates to an electronic component with a shield plate and to a shield plate of an electronic component.

2. Description of the Related Art

Hitherto, to protect electronic components, typically, semiconductor devices, from external noise or to reduce radiation of noise from electronic components to the exterior, various shield plates are put to practical use.

For the shield plate disclosed in Japanese Unexamined Patent Application Publication No. 2011-14879, a metal plate made of a metal thin film formed into a predetermined shape is used. For the shield plate disclosed in Japanese Unexamined Patent Application Publication No. 2005-26622, a plate in which a metal mesh is supported by a resin film is used.

However, although the shield plates disclosed in Japanese Unexamined Patent Application Publication No. 2011-14879 and Japanese Unexamined Patent Application Publication No. 2005-26622 can block noise of a specific frequency, the inventors of the present invention have discovered that they are unable to block noise of various frequencies.

SUMMARY OF THE INVENTION

Preferred embodiments of the present invention provide shield plates that are each able to efficiently block noise of various frequencies and also provide electronic components including such shield plates.

An electronic component with a shield plate according to a preferred embodiment of the present invention includes a wiring substrate, a surface mount device mounted on a front surface of the wiring substrate, and a shield plate fixed on a side adjacent to a top surface of the surface mount device. The shield plate includes a magnetic ceramic sintered sheet and a first metal film. The magnetic ceramic sintered sheet includes first and second main surfaces. The first metal film is disposed on the first main surface of the magnetic ceramic sintered sheet. With this configuration, the magnetic ceramic sintered sheet defines and functions as a magnetic shield layer, while the first metal film defines and functions as a metal shield layer. The magnetic ceramic sintered sheet has a higher permeability than a composite member in which a magnetic filler is dispersed in a resin layer. This enables the magnetic shield layer to mainly block low-frequency noise with high efficiency. The metal shield layer is able to mainly block high-frequency noise.

In an electronic component according to a preferred embodiment of the present invention, a plurality of slits may preferably be provided on the second main surface of the magnetic ceramic sintered sheet. With this configuration, the plurality of slits on the second main surface of the magnetic ceramic sintered sheet improve the flexibility. The magnetic ceramic sintered sheet is inferior to a composite member or a mesh member in terms of the flexibility. However, providing the slits improves the flexibility. The first metal film is provided on the first main surface of the magnetic ceramic sintered sheet. Even if the magnetic ceramic sintered sheet cracks, the first metal film is not split. That is, the first metal film defines and functions as a support member of the magnetic ceramic sintered sheet, thus maintaining the shape of the shield plate. The provision of the slits does not influence the blocking of low-frequency noise.

In an electronic component according to a preferred embodiment of the present invention, the first metal film may preferably be a metal thin film. In this configuration, since the first metal film is a metal thin film, the entire thickness of the shield plate does not become overly thick. The metal thin film is able to contact the ceramic sintered sheet highly closely.

In an electronic component according to a preferred embodiment of the present invention, the first metal film may preferably be disposed on the first main surface of the magnetic ceramic sintered sheet, and a second metal film may preferably be disposed on the second main surface of the magnetic ceramic sintered sheet. With this configuration, it is possible to even more efficiently block high-frequency noise than when merely the first metal film is provided on the first main surface.

In an electronic component according to a preferred embodiment of the present invention, the second metal film may preferably be a metal thin film. In this configuration, since the second metal film is a metal thin film, the entire thickness of the shield plate does not become overly thick. The metal thin film is able to contact the ceramic sintered sheet highly closely.

In an electronic component according to a preferred embodiment of the present invention, the first main surface of the magnetic ceramic sintered sheet may preferably oppose the surface mount device. In this configuration, the first metal film is disposed on the first main surface and is thus easy to connect to a ground of the electronic component. This is able to efficiently transfer high-frequency noise to a ground, thus enhancing the shielding characteristics.

In an electronic component according to a preferred embodiment of the present invention, a conductor that connects the first metal film and a surface electrode on the wiring substrate may preferably be provided. With this configuration, it is possible to efficiently transfer high-frequency noise conducted to the first metal film to the surface electrode on the wiring substrate, thereby enhancing the shielding characteristics.

In an electronic component according to a preferred embodiment of the present invention, a sealing resin may preferably be provided on the front surface of the wiring substrate, and the shield plate may preferably be fixed on a side closer to a top surface of the sealing resin. In this configuration, the surface mount device fixed on the front surface of the wiring substrate is protected by the sealing resin, thereby enhancing the reliability. It is also possible to easily fix the shield plate at a desired position.

In an electronic component according to a preferred embodiment of the present invention, a via-electrode that passes through the magnetic ceramic sintered sheet may preferably be provided. One end of the via-electrode is exposed on the first main surface, and another end thereof is exposed on the second main surface. In this configuration, the provision of the via-electrode passing through the magnetic ceramic sintered sheet can easily connect the first metal film to a ground of the electronic component. It is thus possible to efficiently transfer high-frequency noise to a ground, thereby enhancing the shielding characteristics.

An electronic component with a shield plate according to a preferred embodiment of the present invention includes a wiring substrate, a surface mount device mounted on a front surface of the wiring substrate, and a shield plate fixed on a side adjacent to a top surface of the surface mount device. A plurality of slits are provided on one main surface of the shield plate. A metal film is disposed only on the main surface of the shield plate on which the plurality of slits are provided. With this configuration, as well, it is possible to block both of low-frequency noise and high-frequency noise.

A shield plate of an electronic component according to a preferred embodiment of the present invention includes a magnetic ceramic sintered sheet and a metal film. The magnetic ceramic sintered sheet includes first and second main surfaces. The metal film is disposed on at least one of the first and second main surfaces of the magnetic ceramic sintered sheet. In this configuration, merely disposing the shield plate on the front surface (top surface) of an electronic component makes it possible to block both of low-frequency noise and high-frequency noise.

In an electronic component according to a preferred embodiment of the present invention, the surface mount device includes first and second surface mount devices mounted adjacent to each other on the wiring substrate. The first and second surface mount devices are covered with a sealing resin. The sealing resin includes a cavity. An area of the sealing resin where the cavity is provided defines a thinner portion. The thinner portion has a smaller thickness than an area of the sealing resin where the first and second surface mount devices are disposed. This configuration makes it possible to concentrate a stress on the thinner portion having a smaller thickness.

In an electronic component according to a preferred embodiment of the present invention, the cavity of the sealing resin may preferably be opened on a top surface or a bottom surface of the sealing resin. In this configuration, the electronic component is easy to bend in a predetermined direction.

In an electronic component according to a preferred embodiment of the present invention, when seeing one main surface of the wiring substrate from one main surface of the first metal film in a plan view, the thinner portion is provided between the first and second surface mount devices. This configuration makes it possible to reduce an unwanted stress to be applied to the first and second surface mount devices.

In an electronic component according to a preferred embodiment of the present invention, the surface mount device includes first and second surface mount devices mounted adjacent to each other on the wiring substrate. When seeing one main surface of the wiring substrate from one main surface of the first metal film in a plan view, a plurality of slits are provided between the first and second surface mount devices. An area where the plurality of slits are provided defines a thinner portion. The thinner portion has a smaller thickness than an area where the first and second surface mount devices are disposed. In this configuration, the thinner portion is able to be easily defined by using the plurality of slits, and also, a stress can be concentrated on the thinner portion.

In an electronic component according to a preferred embodiment of the present invention, an inductor conductor is provided on a side adjacent to a top surface of the first surface mount device. The surface mount device generates a first magnetic flux, and the inductor conductor generates a second magnetic flux. When seeing one main surface of the wiring substrate from one main surface of the first metal film in a plan view, the inductor conductor is disposed at a position at which at least a portion of an opening of the inductor conductor overlaps the first surface mount device so that the inductor conductor opposes the first surface mount device. The inductor conductor is wound in a direction in which the second magnetic flux generated from the inductor conductor and the first magnetic flux generated from the first surface mount device attenuate each other. With this configuration, the first magnetic flux generated from the first surface mount device toward the top surface and the second magnetic flux generated from the inductor conductor can attenuate each other, thus improving the characteristics of the electronic component.

According to preferred embodiments of the present invention, it is possible to efficiently block noise of various frequencies.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

First Preferred Embodiment

Figure 1A:
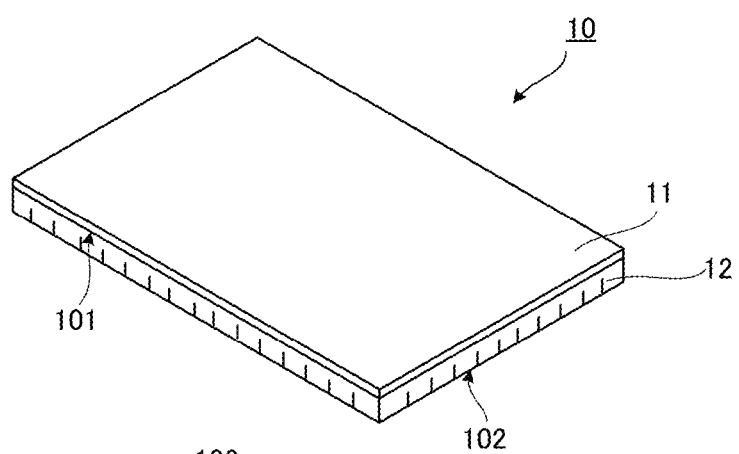
FIG. 1A is an external perspective view of a shield plate of an electronic component according to a first preferred embodiment of the present invention, as viewed from the side of a first main surface.
Figure 1B:
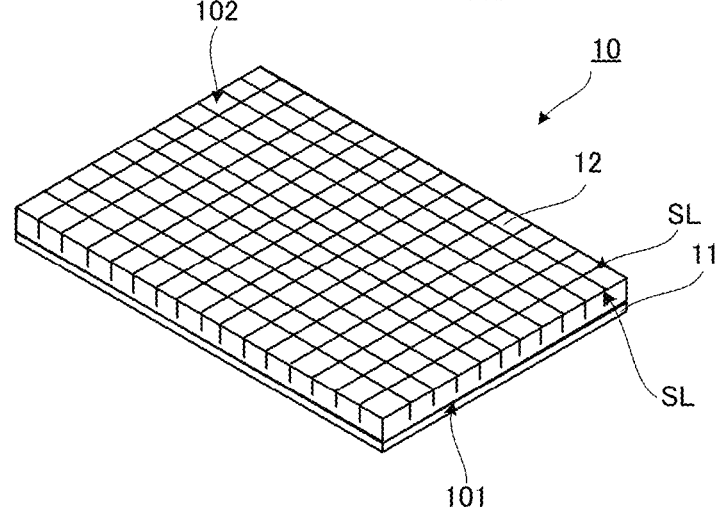
FIG. 1B is an external perspective view of the shield plate as viewed from the side of a second main surface.
Figure 2A:
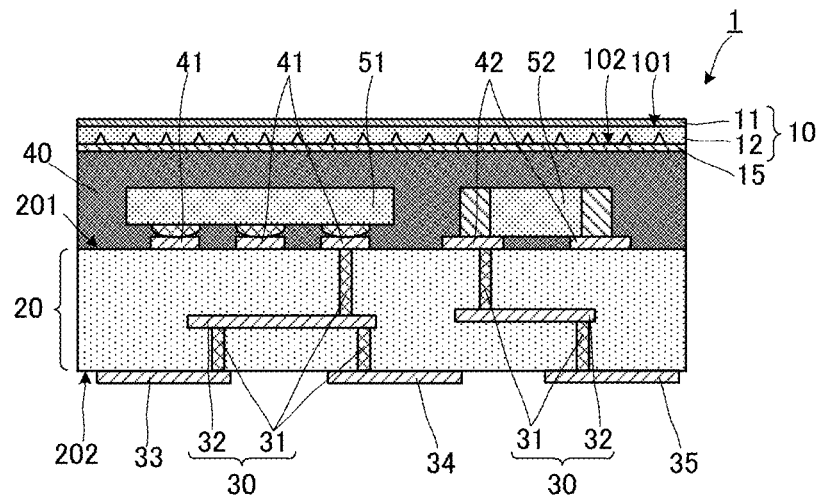
FIG. 2A is a side sectional view illustrating the configuration of the electronic component according to the first preferred embodiment of the present invention.
Figure 2B:
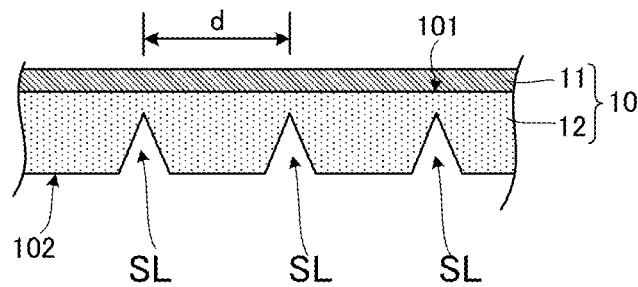
FIG. 2B is an enlarged view of a portion of the shield plate.

An electronic component with a shield plate according to a first preferred embodiment of the present invention will be described below with reference to the drawings. FIG. 1A is an external perspective view of a shield plate of an electronic component according to the first preferred embodiment of the present invention, as viewed from the side of a first main surface. FIG. 1B is an external perspective view of the shield plate according to the first preferred embodiment of the present invention, as viewed from the side of a second main surface. FIG. 2A is a side sectional view illustrating the configuration of the electronic component according to the first preferred embodiment of the present invention. FIG. 2B is an enlarged view of a portion of the shield plate shown in FIG. 2A. For the sake of easy representation, some reference numerals are not shown in FIGS. 1A and 1B.

As shown in FIGS. 1A and 1B, a shield plate 10 preferably includes a metal film 11 and a magnetic ceramic sintered sheet 12. The metal film 11 corresponds to a "first metal film". The metal film 11 is provided on a first main surface 101 of the magnetic ceramic sintered sheet 12. On a second main surface 102 of the magnetic ceramic sintered sheet 12, plural slits SL are provided.

As shown in FIG. 2A, an electronic component 1 preferably includes the shield plate 10, a printed wiring board 20, a sealing resin 40, and surface-mount electronic devices 51 and 52. The shield plate 10 is fixed on the side adjacent to the front surfaces of the surface-mount electronic devices 51 and 52 and the front surface of the printed wiring board 20 with a bonding layer 15 interposed therebetween.

The printed wiring board 20 preferably has a rectangular or substantially rectangular shape in a plan view, that is, it is preferably defined as a rectangular or substantially rectangular prism. In other words, the printed wiring board 20 preferably includes first and second main surfaces 201 and 202 which oppose each other and side surfaces which interconnect the first and second main surfaces 201 and 202. The printed wiring board 20 is preferably a glass epoxy substrate made of FR4, for example.

Ground terminal conductors 33 and 34 and an external connecting terminal conductor 35 are provided on the second main surface 202 of the printed wiring board 20. Land conductors 41 and 42 used in mounting components are provided on the first main surface 201 of the printed wiring board 20. By using connecting conductors 31 and 32, the land conductors 41 are connected with a predetermined circuit pattern to the ground terminal conductors 33 and 34, and the land conductors 42 are connected with a predetermined circuit pattern to the external connecting terminal conductor 35.

The surface-mount electronic device 51 is mounted on the land conductors 41, while the surface-mount electronic device 52 is mounted on the land conductors 42.

The sealing resin 40 is provided on the first main surface 201 of the printed wiring board 20. The sealing resin 40 covers the first main surface 201 of the printed wiring board 20 and the surface-mount electronic devices 51 and 52.

The shield plate 10 is fixed on the surface of the sealing resin 40 opposite the surface which abuts on the printed wiring board 20. That is, the shield plate 10 is preferably disposed on the side adjacent to the top surface of the printed wiring board 20, and is also disposed on the side adjacent to the top surface of the sealing resin 40. The shield plate 10 is attached to the sealing resin 40 such that the second main surface 102 opposes the sealing resin 40. The shield plate 10 is disposed on the sealing resin 40 with the bonding layer 15 interposed therebetween. The bonding layer 15 may be either one of a conductive layer and an insulating layer.

As discussed above, the shield plate 10 includes the metal film 11 and the magnetic ceramic sintered sheet 12. The metal film 11 is preferably a metal thin film, for example. The total thickness of the metal thin film is preferably about 25 μm to about 50 μm, for example. This makes it possible to prevent the shield plate 10 from becoming thick and to obtain a metal shield layer with compact metal particles.

The metal film 11 is preferably formed, by sputtering, for example, on the magnetic ceramic sintered sheet 12 which has been fired. The metal film 11 may alternatively be a conductive paste film applied to the magnetic ceramic sintered sheet 12. In this case, a conductive paste may be applied to the magnetic ceramic sintered sheet 12 which has been fired and be burned. Alternatively, a conductive paste may be applied to the magnetic ceramic sintered sheet 12 which has not been fired, and then, the magnetic ceramic sintered sheet 12 may be fired together with the conductive paste. By forming the metal film 11 in this manner, the metal film 11 and the magnetic ceramic sintered sheet 12 highly closely contact each other.

In the shield plate 10 configured as described above, the magnetic ceramic sintered sheet 12 defines and functions as a magnetic shield layer, while the metal film 11 defines and functions as a metal shield layer. The magnetic ceramic sintered sheet 12 defining a magnetic shield layer has a higher permeability than a composite member in which a magnetic filler is dispersed in a resin layer. This enables the magnetic shield layer to mainly block low-frequency noise with high efficiency. The metal film 11 may preferably be made of a metal, such as Ni, Si, Cu, and permalloy, for example. This enables the metal film 11 to mainly block high-frequency noise with high efficiency. Low frequencies are frequencies lower than about 100 MHz, and high frequencies are frequencies higher than about 100 MHz.

Plural slits SL are provided in the magnetic ceramic sintered sheet 12. The slits SL extend from the second main surface 102 toward the first main surface 101 of the magnetic ceramic sintered sheet 12. The slits SL are preferably provided in a lattice shape in a plan view of the second main surface 102 of the magnetic ceramic sintered sheet 12. As shown in FIG. 2B, the distance d between slits is preferably about 2 mm, for example.

The magnetic ceramic sintered sheet 12 is a sintered sheet and is thus inferior to a composite member or a mesh member in terms of the flexibility. However, by providing the slits SL, the flexibility is improved. Although providing at least one slit SL is sufficient, providing plural slits further improves the flexibility. The slits SL are not provided to divide the shield plate 10, but to improve the flexibility. Thus, the slits SL may not necessarily be provided in a V shape, but may be less deep than slits provided in another component. Additionally, it is not necessary to provide the slits SL continuously from one end to the other end of the magnetic ceramic sintered sheet 12. For example, plural depressions may intermittently be provided linearly so as to define the slits SL.

The metal film 11 is provided on the first main surface 101 of the magnetic ceramic sintered sheet 12. Even if the magnetic ceramic sintered sheet 12 cracks via the slits SL when it bends, the metal film 11 defines and functions as a support member of the magnetic ceramic sintered sheet 12. This maintains the shape of the shield plate 10, and no gaps are produced in the shield plate 10 via the slits SL. Thus, the provision of the slits SL does not influence the blocking of low-frequency noise. With the configuration of the present preferred embodiment, it is possible to implement the shield plate 10 and the electronic component 1 that are able to block low-frequency noise and high-frequency noise. The shield plate 10 is easy to attach because it deforms to match the shape of an attaching portion and closely contacts it.

Second Preferred Embodiment

Figure 3:
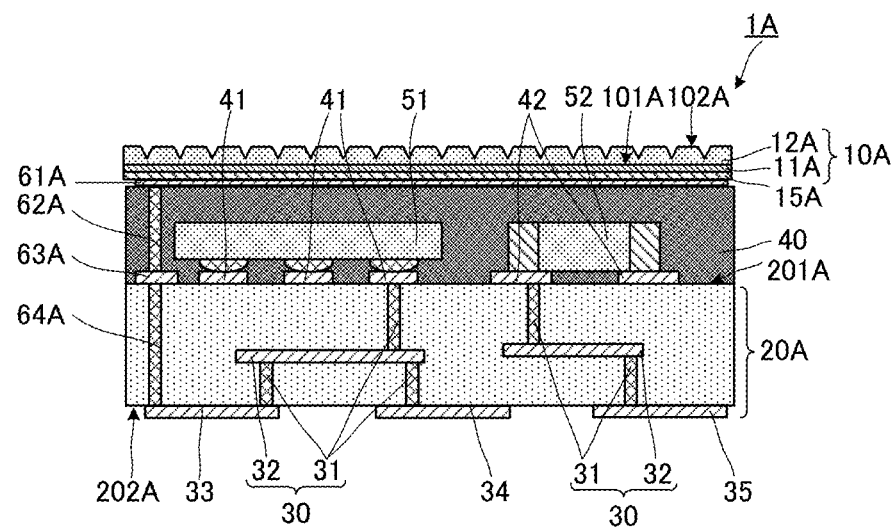
FIG. 3 is a side sectional view illustrating the configuration of an electronic component with a shield plate according to a second preferred embodiment of the present invention.

An electronic component with a shield plate according to a second preferred embodiment of the present invention will be described below with reference to the drawing. FIG. 3 is a side sectional view illustrating the configuration of the electronic component according to the second preferred embodiment of the present invention.

As shown in FIG. 3, an electronic component 1A with a shield plate according to the second preferred embodiment is different from the electronic component 1 according to the first preferred embodiment in that via-hole conductors 62A and 64A and a terminal conductor 63A are provided and the shape of a shield plate 10A of an electronic component is different. The shield plate 10A preferably includes a metal film 11A and a magnetic ceramic sintered sheet 12A. The configurations of the other elements of the electronic component 1A are preferably the same as or similar to those of the electronic component 1 and will not be explained. The metal film 11A corresponds to the metal film 11 of the first preferred embodiment of the present invention. The magnetic ceramic sintered sheet 12A corresponds to the magnetic ceramic sintered sheet 12 of the first preferred embodiment of the present invention.

As shown in FIG. 3, the shield plate 10A is fixed on the surface of the sealing resin 40 opposite the surface which abuts on a printed wiring board 20A. The shield plate 10A is disposed on the side adjacent to the top surface of the sealing resin 40. The shield plate 10A is attached to the sealing resin 40 such that a first main surface 101A opposes the sealing resin 40. In other words, the shield plate 10A having a vertically inverted shape of the shield plate 10 shown in FIGS. 2A and 2B is preferably attached to a connecting conductor 61A with a bonding layer 15A interposed therebetween. The connecting conductor 61A is disposed on the front surface of the sealing resin 40. The bonding layer 15A is a conductive layer.

The shield plate 10A includes the metal film 11A and the magnetic ceramic sintered sheet 12A. The metal film 11A corresponds to the "first metal film". The metal film 11A is provided on the first main surface 101A of the magnetic ceramic sintered sheet 12A. On a second main surface 102A of the magnetic ceramic sintered sheet 12A, plural slits SL are provided.

The connecting conductor 61A is provided on the front surface of the sealing resin 40. The terminal conductor 63A is provided on the surface of the printed wiring board 20A which abuts on the sealing resin 40. The via-hole conductor 62A is embedded within and passes through the sealing resin 40. One end of the via-hole conductor 62A is exposed on the surface of the sealing resin 40 to which the shield plate 10A is attached and is connected to the connecting conductor 61A. The other end of the via-hole conductor 62A is exposed on the surface of the sealing resin 40 to which the printed wiring board 20A is attached and is connected to the terminal conductor 63A.

The via-hole conductor 64A passes through the printed wiring board 20A. One end of the via-hole conductor 64A is exposed on a first main surface 201A of the printed wiring board 20A and is connected to the terminal conductor 63A. The other end of the via-hole conductor 64A is exposed on a second main surface 202A of the printed wiring board 20A and is connected to the ground terminal conductor 33.

In the shield plate 10A configured as described above, the magnetic ceramic sintered sheet 12A defines and functions as a magnetic shield layer and is able to mainly block low-frequency noise with high efficiency. The metal film 11A defines and functions as a metal shield layer and is able to mainly block high-frequency noise with high efficiency. High-frequency noise conducted to the shield plate 10A passes through the connecting conductor 61A, the via-hole conductor 62A, the terminal conductor 63A, and the via-hole conductor 64A and is efficiently transferred to a ground of the electronic component 1A. Shielding characteristics for high-frequency noise are thus improved.

The connecting conductor 61A may be omitted if so desired. However, the connecting conductor 61A is able to more efficiently transfer high-frequency noise to a ground.

In the above-described configuration, the metal film 11A is easy to connect to a ground of the electronic component 1A.

Third Preferred Embodiment

Figure 4:
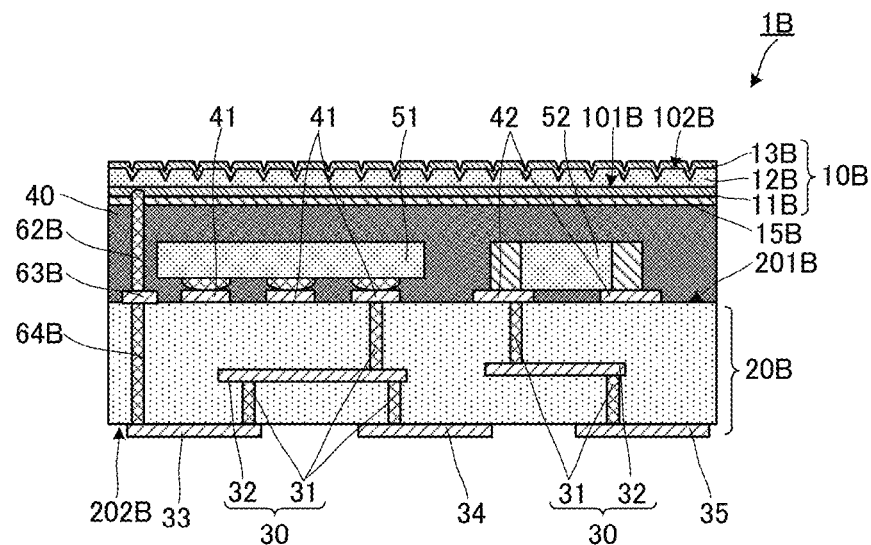
FIG. 4 is a side sectional view illustrating the configuration of an electronic component with a shield plate according to a third preferred embodiment of the present invention.

An electronic component with a shield plate according to a third preferred embodiment of the present invention will be described below with reference to the drawing. FIG. 4 is a side sectional view illustrating the configuration of the electronic component according to the third preferred embodiment of the present invention.

As shown in FIG. 4, an electronic component 1B with a shield plate according to the third preferred embodiment is different from the electronic component 1 according to the first preferred embodiment in that a metal post 62B, a terminal conductor 63B, and a via-hole conductor 64B are provided and the shapes of a shield plate 10B of an electronic component and a magnetic ceramic sintered sheet 12B are different. The configurations of the other elements of the electronic component 1B are preferably the same as or similar to those of the electronic component 1 and will not be explained. A metal film 11B corresponds to the metal film 11 of the first preferred embodiment of the present invention. The magnetic ceramic sintered sheet 12B corresponds to the magnetic ceramic sintered sheet 12 of the first preferred embodiment of the present invention.

As shown in FIG. 4, the shield plate 10B is fixed on the surface of the sealing resin 40 opposite the surface which abuts on a printed wiring board 20B. The shield plate 10B is disposed on the side adjacent to the top surface of the sealing resin 40. The shield plate 10B is attached to the sealing resin 40 such that a first main surface 101B opposes the sealing resin 40. In other words, the shield plate 10B having a vertically inverted shape of the shield plate 10 shown in FIGS. 2A and 2B is attached to the sealing resin 40 with a bonding layer 15B interposed therebetween.

The shield plate 10B preferably includes the metal film 11B, the magnetic ceramic sintered sheet 12B, and a metal film 13B. The metal film 11B corresponds to the "first metal film". The metal film 11B is provided on the first main surface 101B of the magnetic ceramic sintered sheet 12B. The metal film 13B corresponds to a "second metal film". The metal film 13B is provided on a second main surface 102B of the magnetic ceramic sintered sheet 12B. The metal films 11B and 13B are preferably provided by sputtering, for example. On the second main surface 102B of the magnetic ceramic sintered sheet 12B, plural slits SL are provided.

The terminal conductor 63B is provided on the surface of the printed wiring board 20B which abuts on the sealing resin 40. The metal post 62B passes through the sealing resin 40 and is provided on the surface of the sealing resin 40 which abuts on a first main surface 201B of the printed wiring board 20B toward the surface of the sealing resin 40 to which the shield plate 10B is attached. One end of the metal post 62B projects from the front surface of the sealing resin 40, while the other end thereof contacts the terminal conductor 63B. The metal post 62B is preferably a conductor.

The via-hole conductor 64B passes through the printed wiring board 20B. One end of the via-hole conductor 64B is exposed on the first main surface 201B of the printed wiring board 20B and is connected to the terminal conductor 63B. The other end of the via-hole conductor 64B is exposed on a second main surface 202B of the printed wiring board 20B. The metal film 11B contacts the metal post 62B.

In the shield plate 10B configured as described above, the magnetic ceramic sintered sheet 12B defines and functions as a magnetic shield layer and is able to mainly block low-frequency noise with high efficiency. The metal films 11B and 13B defines and functions as metal shield layers. Both of the first and second main surfaces 101B and 102B of the magnetic ceramic sintered sheet 12B defines and functions as metal shield layers and are thus able to mainly block high-frequency noise with even higher efficiency. High-frequency noise passes through the metal post 62B, the terminal conductor 63B, and the via-hole conductor 64B and is efficiently transferred to a ground of the electronic component 1B.

Fourth Preferred Embodiment

Figure 5A:
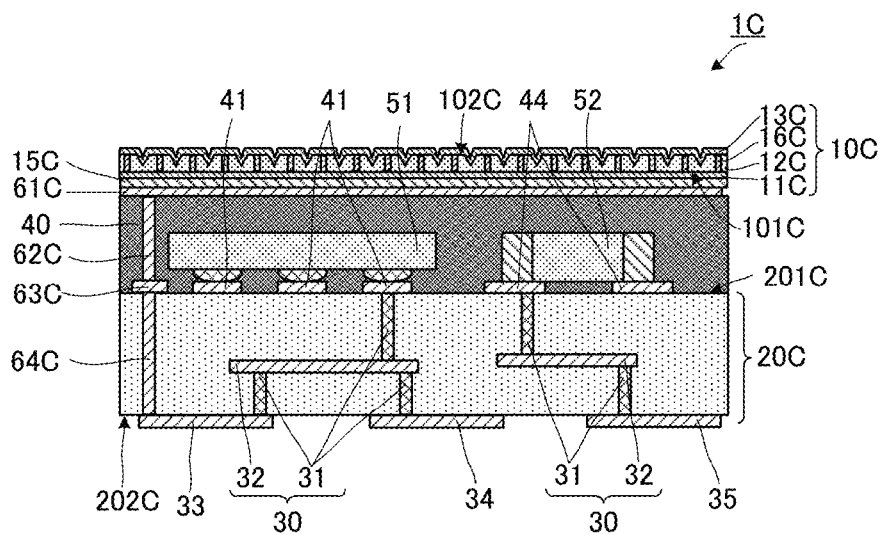
FIG. 5A is a side sectional view illustrating the configuration of an electronic component with a shield plate according to a fourth preferred embodiment of the present invention.
Figure 5B:
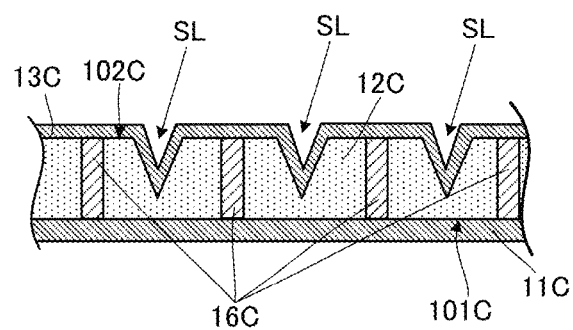
FIG. 5B is an enlarged view of a portion of the shield plate.

An electronic component with a shield plate according to a fourth preferred embodiment of the present invention will be described below with reference to the drawing. FIG. 5A is a side sectional view illustrating the configuration of the electronic component according to the fourth preferred embodiment of the present invention. FIG. 5B is an enlarged view of a portion of the shield plate shown in FIG. 5A. For the sake of easy representation, some reference numerals are not shown in FIG. 5A.

As shown in FIGS. 5A and 5B, an electronic component 1C with a shield plate according to the fourth preferred embodiment is different from the electronic component 1 according to the first preferred embodiment in that a connecting conductor 61C, via-hole conductors 62C and 64C, and a terminal conductor 63C are provided and the shapes of a shield plate 10C of an electronic component and a magnetic ceramic sintered sheet 12c are different. The configurations of the other elements of the electronic component 1C are preferably the same as or similar to those of the electronic component 1 and will not be explained. A metal film 11C corresponds to the metal film 11 of the first preferred embodiment of the present invention. The magnetic ceramic sintered sheet 12C corresponds to the magnetic ceramic sintered sheet 12 of the first preferred embodiment of the present invention.

As shown in FIG. 5A, the shield plate 10C is fixed on the surface of the sealing resin 40 opposite the surface which abuts on a printed wiring board 20C. The shield plate 10C is disposed on the side adjacent to the top surface of the sealing resin 40. The shield plate 10C is attached to the sealing resin 40 such that a first main surface 101C opposes the sealing resin 40. In other words, the shield plate 10C having a vertically inverted shape of the shield plate 10 shown in FIGS. 2A and 1B is attached to the sealing resin 40 with the connecting conductor 61C and a bonding layer 15C interposed therebetween.

The shield plate 10C preferably includes the metal film 11C, the magnetic ceramic sintered sheet 12C, a metal film 13C, and via-conductors 16C. The metal film 11C corresponds to the "first metal film". The metal film 11C is provided on the first main surface 101C of the magnetic ceramic sintered sheet 12C. The metal film 13C corresponds to the "second metal film". The metal film 13C is provided on a second main surface 102C of the magnetic ceramic sintered sheet 12C. The metal film 11C is provided on the first main surface 101C and the metal film 13C is provided on the second main surface 102C of the shield plate 10C preferably by sputtering, for example. On the second main surface 102C of the magnetic ceramic sintered sheet 12C, plural slits SL are provided.

The plural via-conductors 16C are provided in the magnetic ceramic sintered sheet 12C. The via-conductors 16C are preferably provided between the slits SL. The via-conductors 16C pass through the magnetic ceramic sintered sheet 12C. One end of each of the via-conductors 16C is exposed on the first main surface 101C of the magnetic ceramic sintered sheet 12C and is connected to the metal film 11C. The other ends of the via-conductors 16C are exposed on the second main surface 102C of the magnetic ceramic sintered sheet 12C and are connected to the metal film 13C.

The connecting conductor 61C is provided on the front surface of the sealing resin 40. The terminal conductor 63C is provided on the surface of the printed wiring board 20C which abuts on the sealing resin 40. The via-hole conductor 62C passes through the sealing resin 40. One end of the via-hole conductor 62C is exposed on the surface of the sealing resin 40 to which the shield plate 10C is attached and is connected to the connecting conductor 61C. The other end of the via-hole conductor 62C is exposed on the surface of the sealing resin 40 to which the printed wiring board 20C is attached and is connected to the terminal conductor 63C. The via-hole conductor 64C passes through the printed wiring board 20C. One end of the via-hole conductor 64C is exposed on a first main surface 201C of the printed wiring board 20C and is connected to the terminal conductor 63C. The other end of the via-hole conductor 64C is exposed on a second main surface 202C of the printed wiring board 20C and is connected to the ground terminal conductor 33.

In the shield plate 10C configured as described above, the magnetic ceramic sintered sheet 12C defines and functions as a magnetic shield layer and is able to mainly block low-frequency noise with high efficiency. The metal films 11C and 13C define and function as metal shield layers. Both of the first and second main surfaces 101C and 102C of the magnetic ceramic sintered sheet 12C define and function as metal shield layers and are thus able to mainly block high-frequency noise with even higher efficiency. Additionally, the via-conductors 16C are able to electrically connect the metal film 11C to the metal film 13C and the connecting conductor 61C, thus making it possible to transfer a high-frequency noise conducted to the metal film 11C to a ground of the electronic component 1C.

Fifth Preferred Embodiment

Figure 6A:
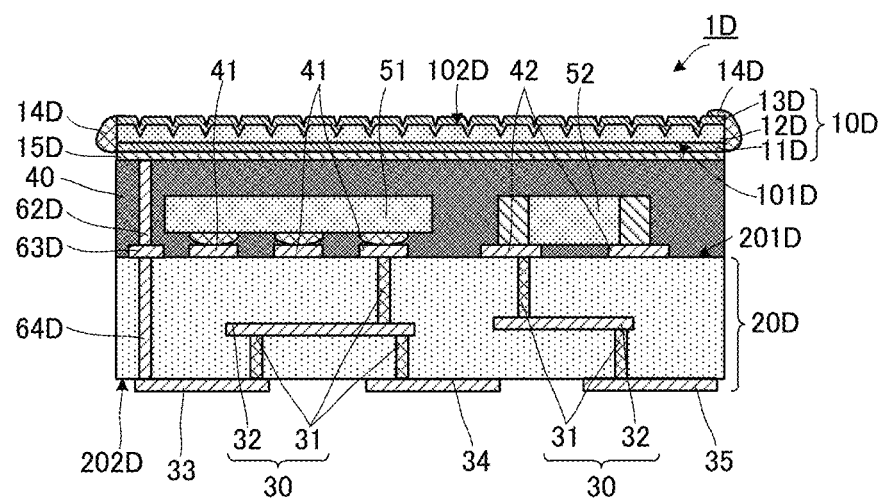
FIG. 6A is a side sectional view illustrating the configuration of an electronic component with a shield plate according to a fifth preferred embodiment of the present invention.
Figure 6B:
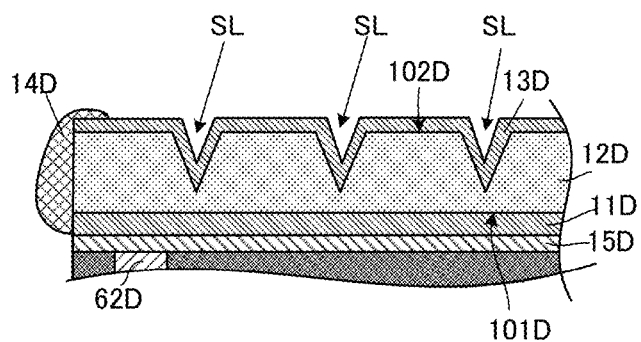
FIG. 6B is an enlarged view of a portion of the shield plate.

An electronic component with a shield plate according to a fifth preferred embodiment of the present invention will be described below with reference to the drawing. FIG. 6A is a side sectional view illustrating the configuration of the electronic component according to the fifth preferred embodiment of the present invention. FIG. 6B is an enlarged view of a portion of the shield plate shown in FIG. 6A.

As shown in FIGS. 6A and 6B, an electronic component 1D with a shield plate according to the fifth preferred embodiment is different from the electronic component 1 according to the first preferred embodiment in that a solder 14D, via-hole conductors 32D and 64D, and a terminal conductor 63D are provided and the shape of a shield plate 10D of an electronic component is different. The configurations of the other elements of the electronic component 1D are preferably the same as or similar to those of the electronic component 1 and will not be explained. A metal film 11D corresponds to the metal film 11 of the first preferred embodiment of the present invention. A magnetic ceramic sintered sheet 12D corresponds to the magnetic ceramic sintered sheet 12 of the first preferred embodiment of the present invention.

As shown in FIG. 6A, the shield plate 10D is fixed on the surface of the sealing resin 40 opposite the surface which abuts on a printed wiring board 20D. The shield plate 10D is disposed on the side adjacent to the top surface of the sealing resin 40. The shield plate 10D is preferably attached to the sealing resin 40 such that a first main surface 101D opposes the sealing resin 40. In other words, the shield plate 10D having a vertically inverted shape of the shield plate 10 shown in FIGS. 2A and 2B is attached to the sealing resin 40 with a bonding layer 15D interposed therebetween.

The shield plate 10D preferably includes the metal film 11D, the magnetic ceramic sintered sheet 12D, and a metal film 13D. The metal film 11D corresponds to the "first metal film". The metal film 11D is provided on the first main surface 101D of the magnetic ceramic sintered sheet 12D. The metal film 13D corresponds to the "second metal film". The metal film 11D is preferably provided on the first main surface 101D of the shield plate 10D by sputtering, for example, while the metal film 13D is preferably provided on a second main surface 102D of the shield plate 10D by sputtering, for example. On the second main surface 102D of the magnetic ceramic sintered sheet 12D, plural slits SL are provided.

The magnetic ceramic sintered sheet 12D includes side surfaces which interconnect the first and second main surfaces 101D and 102D. The metal films 11D and 13D are provided to extend to the side surfaces of the magnetic ceramic sintered sheet 12D. The solder 14D is disposed along each of the side surfaces of the magnetic ceramic sintered sheet 12D so as to connect the metal films 11D and 13D with each other.

The via-hole conductor 62D passes through the sealing resin 40. One end of the via-hole conductor 62D is exposed on the surface of the sealing resin 40 to which the shield plate 10D is attached. The other end of the via-hole conductor 62D is exposed on the surface of the sealing resin 40 to which the printed wiring board 20D is attached and is connected to the terminal conductor 63D. The via-hole conductor 64D passes through the printed wiring board 20D. One end of the via-hole conductor 64D is exposed on a first main surface 201D of the printed wiring board 20D and is connected to the terminal conductor 63D. The other end of the via-hole conductor 64D is exposed on a second main surface 202D of the printed wiring board 20D and is connected to the ground terminal conductor 33.

In the shield plate 10D configured as described above, the magnetic ceramic sintered sheet 12D defines and functions as a magnetic shield layer and is able to mainly block low-frequency noise with high efficiency. The metal films 11D and 13D define and function as metal shield layers. Both of the first and second main surfaces 101D and 102D of the magnetic ceramic sintered sheet 12D define and function as metal shield layers and are thus able to mainly block high-frequency noise with even higher efficiency. Additionally, high-frequency noise conducted to the metal film 13D passes through the solder 14D, the via-hole conductor 62D, the terminal conductor 63D, and the via-hole conductor 64D and is efficiently transferred to a ground of the electronic component 1D.

In the above-described fifth preferred embodiment of the present invention, the metal shield layers defined by the metal films 11D and 13D are provided on the magnetic ceramic sintered sheet 12D. However, the mere provision of the metal film 13D on the second main surface 102D of the magnetic ceramic sintered sheet 12D may still achieve the above-described advantages.

Sixth Preferred Embodiment

Figure 7:
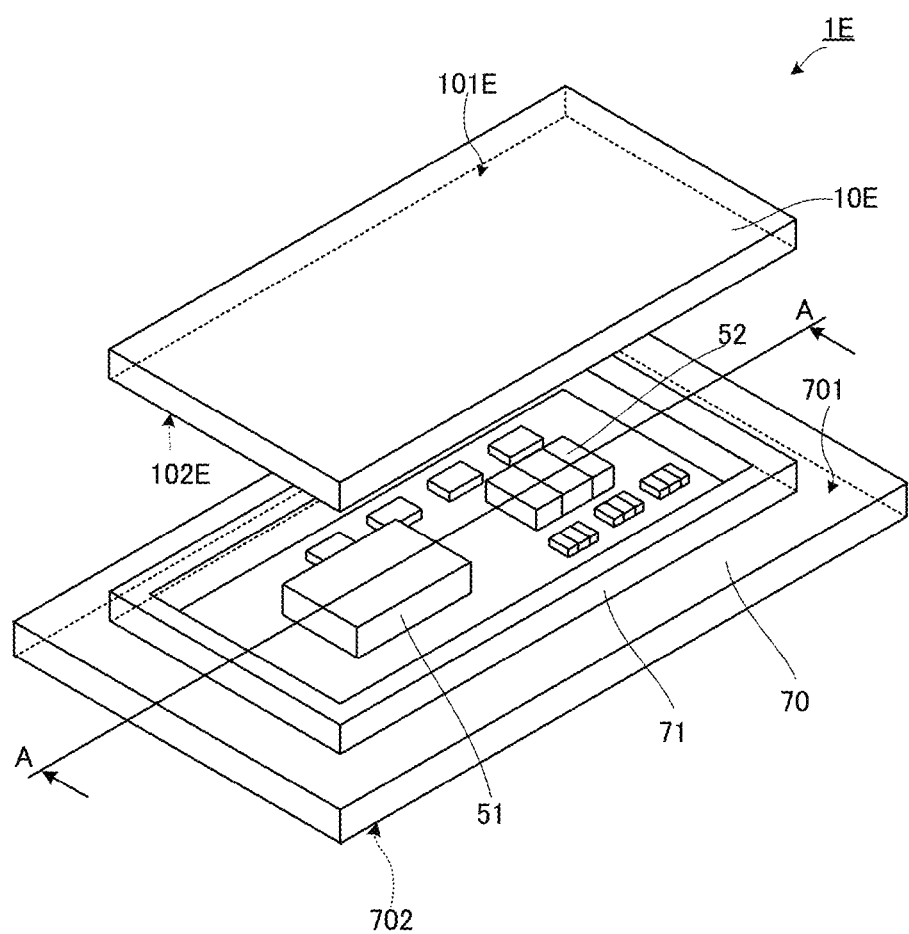
FIG. 7 is an exploded perspective view partly illustrating the configuration of an electronic component with a shield plate according to a sixth preferred embodiment of the present invention.
Figure 8A:
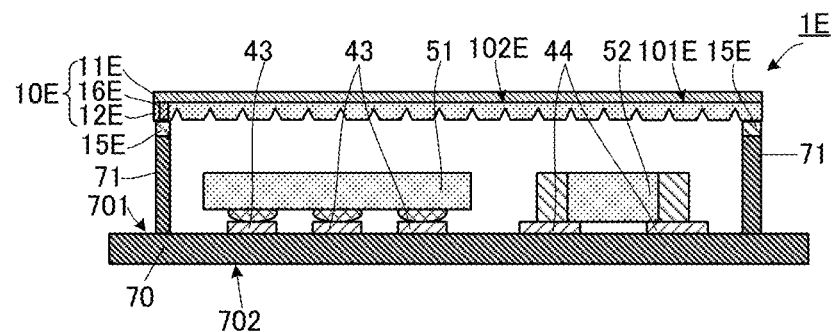
FIG. 8A is a side sectional view illustrating the configuration of the electronic component according to the sixth preferred embodiment of the present invention.
Figure 8B:
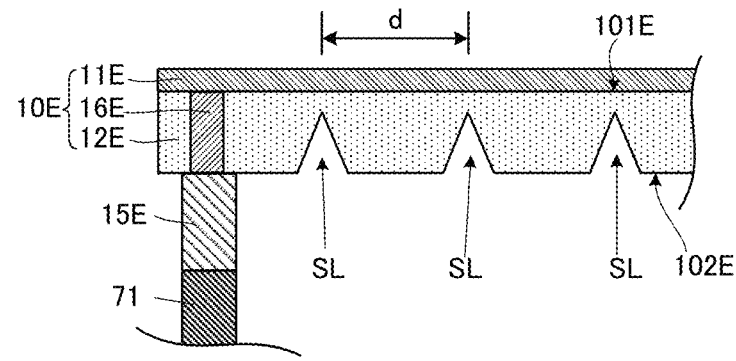
FIG. 8B is an enlarged view of a portion of the side sectional view illustrating the configuration of the electronic component according to the sixth preferred embodiment of the present invention.

An electronic component with a shield plate according to a sixth preferred embodiment of the present invention will be described below with reference to the drawings. FIG. 7 is an exploded perspective view partly illustrating the configuration of an electronic component 1E with a shield plate according to the sixth preferred embodiment of the present invention. FIG. 8A is a sectional view taken along line A-A of FIG. 7 according to the sixth preferred embodiment of the present invention. FIG. 8B is an enlarged view of a portion of the shield plate shown in FIG. 8A.

As shown in FIGS. 7, 8A, and 8B, the electronic component 1E preferably includes a shield plate 10E, surface-mount electronic devices 51 and 52, a printed wiring board 70, a metal frame 71, land conductors 43 and 44 used in mounting components, a bonding layer 15E, and a via-conductor 16E. The shield plate 10E includes a metal film 11E and a magnetic ceramic sintered sheet 12E. The metal film 11E corresponds to the "first metal film". The metal film 11E is provided on a first main surface 101E of the magnetic ceramic sintered sheet 12D. Plural slits SL are provided on a second main surface 102E of the magnetic ceramic sintered sheet 12E.

The printed wiring board 70 preferably has a rectangular or substantially rectangular shape in a plan view, that is, it is preferably provided in a rectangular or substantially rectangular prism. In other words, the printed wiring board 70 includes first and second main surfaces 701 and 702 which oppose each other and side surfaces which interconnect the first and second main surfaces 701 and 702. The printed wiring board 70 is a glass epoxy substrate made of FR4, for example.

The land conductors 43 and 44 are preferably provided on the first main surface 701 of the printed wiring board 70. The surface-mount electronic device 51 is mounted on the land conductors 43, while the surface-mount electronic device 52 is mounted on the land conductors 44.

The metal frame 71 is preferably a rectangular or substantially rectangular frame. The metal frame 71 is fixed on the first main surface 701 of the printed wiring board 70. The metal frame 71 is preferably made of a highly conductive metal. The metal frame 71 surrounds the area where the surface-mount electronic devices 51 and 52 are mounted.

The shield plate 10E is fixed on the surface of the metal frame 71 opposite the surface which abuts on the first main surface 701. The shield plate 10E is attached to the metal frame 71 with the bonding layer 15E interposed therebetween such that the second main surface 102E opposes the first main surface 701 of the printed wiring board 70. With this configuration, the surface-mount electronic devices 51 and 52 are surrounded by the shield plate 10E, the printed wiring board 70, and the metal frame 71. It is preferable that the bonding layer 15E is a conductive layer and has the same or substantially the same frame shape as the metal frame 71. The bonding layer 15E may preferably be a conductive bonding member, such as a solder, for example.

As discussed above, the shield plate 10E includes the metal film 11E and the magnetic ceramic sintered sheet 12E. The metal film 11E is preferably a metal thin film. The thickness of the metal thin film is preferably about 25 µm to about 50 µm, for example. This makes it possible to prevent the shield plate 10E having the metal film 11E from becoming thick and to obtain a metal shield layer with compact metal particles.

The metal film 11E is preferably formed, by sputtering, for example, on the magnetic ceramic sintered sheet 12E which has been fired. The metal film 11E may alternatively be a conductive paste film applied to the magnetic ceramic sintered sheet 12E. In this case, a conductive paste may be applied to the magnetic ceramic sintered sheet 12E which has been fired and be burned. Alternatively, a conductive paste may be applied to the magnetic ceramic sintered sheet 12E which has not been fired, and then, the magnetic ceramic sintered sheet 12E may be fired together with the conductive paste. By forming the metal film 11E in this manner, the metal film 11E and the magnetic ceramic sintered sheet 12E highly closely contact each other.

In the shield plate 10E configured as described above, the magnetic ceramic sintered sheet 12E defines and functions as a magnetic shield layer, while the metal film 11E defines and functions as a metal shield layer. The magnetic ceramic sintered sheet 12E defining a magnetic shield layer has a higher permeability than a composite member in which a magnetic filler is dispersed in a resin layer. This enables the magnetic shield layer to mainly block low-frequency noise with high efficiency. The metal film 11E may preferably be made of a metal, such as Ni, Si, Cu, and permalloy, for example. This enables the metal film 11E to mainly block high-frequency noise with high efficiency.

Plural slits SL are preferably provided in the magnetic ceramic sintered sheet 12E. The distance d between slits shown in FIG. 8B is preferably about 2 mm, for example. The slits SL are provided from the second main surface 102E toward the first main surface 101E of the magnetic ceramic sintered sheet 12E. The slits SL are provided in a lattice shape in a plan view of the second main surface 102E of the magnetic ceramic sintered sheet 12E. The magnetic ceramic sintered sheet 12E is a sintered sheet and is thus inferior to a composite member or a mesh member in terms of the flexibility. However, by providing plural slits SL, the flexibility is improved. Although providing at least one slit SL is sufficient, providing plural slits further improves the flexibility.

The via-conductor 16E is preferably provided in the magnetic ceramic sintered sheet 12E. The via-conductor 16E is provided at the left end of the magnetic ceramic sintered sheet 12E and at a position at which it is able to be connected to the metal frame 71. The via-conductor 16E passes through the magnetic ceramic sintered sheet 12E. One end of the via-conductor 16E is exposed on the first main surface 101E of the magnetic ceramic sintered sheet 12E and is connected to the metal film 11E. The other end of the via-conductor 16E is exposed on the second main surface 102E of the magnetic ceramic sintered sheet 12E and is electrically connected to the metal frame 71 with the bonding layer 15E interposed therebetween.

In the shield plate 10E configured as described above, the magnetic ceramic sintered sheet 12E defines and functions as a magnetic shield layer and is able to mainly block low-frequency noise with high efficiency. The metal film 11E defines and functions as a metal shield layer. The first main surface 101E of the magnetic ceramic sintered sheet 12E defines and functions as a metal shield layer and is thus able to mainly block high-frequency noise with high efficiency. High-frequency noise passes through the via-conductor 16E, the bonding layer 15E, and the metal frame 71 and is efficiently transferred to a ground, which is not shown, of the printed wiring board 70.

As discussed above, the plural slits SL are preferably provided in the magnetic ceramic sintered sheet 12E, thus improving the flexibility of the magnetic ceramic sintered sheet 12E. Because of the metal film 11E on the first main surface 101E of the magnetic ceramic sintered sheet 12E, even if the magnetic ceramic sintered sheet 12E cracks via the slits SL when it bends, the metal film 11E defines and functions as a support member of the magnetic ceramic sintered sheet 12E. This maintains the shape of the shield plate 10E, and no gaps are produced in the magnetic ceramic sintered sheet 12E via the slits SL. Hence, the provision of the slits SL does not influence the blocking of low-frequency noise.

Seventh Preferred Embodiment

Figure 9:
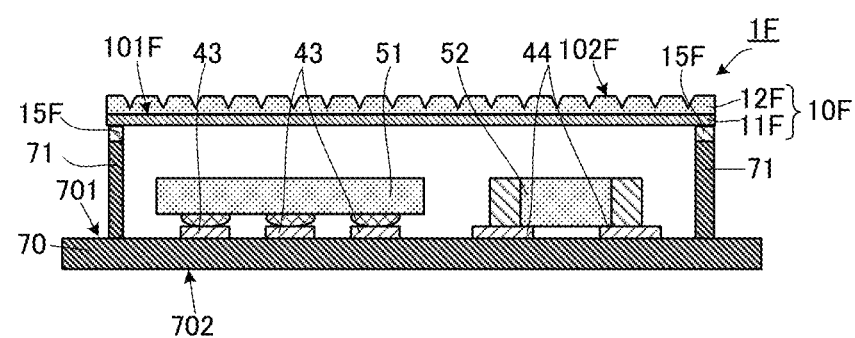
FIG. 9 is a side sectional view illustrating the configuration of an electronic component with a shield plate according to a seventh preferred embodiment of the present invention.

An electronic component with a shield plate according to a seventh preferred embodiment of the present invention will be described below with reference to the drawing. FIG. 9 is a side sectional view illustrating the configuration of the electronic component according to the seventh preferred embodiment of the present invention.

As shown in FIG. 9, an electronic component 1F with a shield plate according to the seventh preferred embodiment is different from the electronic component 1E according to the sixth preferred embodiment in the shape of a shield plate 10F of an electronic component. The configurations of the other elements of the electronic component 1F are preferably the same as or similar to those of the electronic component 1E and will not be explained. A metal film 11F corresponds to the metal film 11E of the sixth preferred embodiment of the present invention. A magnetic ceramic sintered sheet 12F corresponds to the magnetic ceramic sintered sheet 12E of the sixth preferred embodiment of the present invention.

The shield plate 10F is preferably fixed on the surface of the metal frame 71 opposite the surface which abuts on the first main surface 701. The shield plate 10F is attached to the metal frame 71 with a bonding layer 15F interposed therebetween such that a first main surface 101F opposes the first main surface 701 of the printed wiring board 70. In other words, the shield plate 10F having a vertically inverted shape of the shield plate 10E shown in FIGS. 8A and 8B is attached to the metal frame 71 with the bonding layer 15F interposed therebetween. It is preferable that the bonding layer 15F is a conductive layer and has in the same or substantially the same frame shape as the metal frame 71. The bonding layer 15F may preferably be a conductive bonding member, such as a solder, for example.

In the shield plate 10F configured as described above, the magnetic ceramic sintered sheet 12F defines and functions as a magnetic shield layer, while the metal film 11F serves as a metal shield layer. Plural slits SL in the magnetic ceramic sintered sheet 12F are able to improve the flexibility. That is, advantages similar to those of the sixth preferred embodiment are obtained.

Eighth Preferred Embodiment

Figure 10:
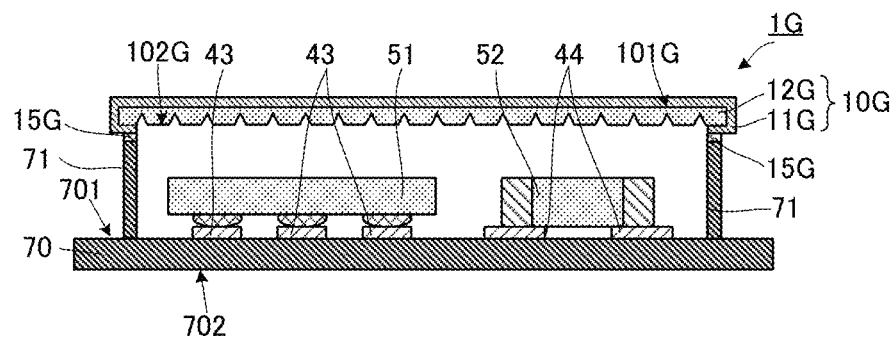
FIG. 10 is a side sectional view illustrating the configuration of an electronic component with a shield plate according to an eighth preferred embodiment of the present invention.

An electronic component with a shield plate according to an eighth preferred embodiment of the present invention will be described below with reference to the drawing. FIG. 10 is a side sectional view illustrating the configuration of the electronic component according to the eighth preferred embodiment of the present invention.

As shown in FIG. 10, an electronic component 1G with a shield plate according to the eighth preferred embodiment is different from the electronic component 1E according to the sixth preferred embodiment in the shape of a shield plate 10G of an electronic component. The configurations of the other elements of the electronic component 1G are preferably the same as or similar to those of the electronic component 1E and will not be explained. A magnetic ceramic sintered sheet 12G corresponds to the magnetic ceramic sintered sheet 12E of the sixth preferred embodiment of the present invention.

A metal film 11G is provided on a first main surface 101G of the magnetic ceramic sintered sheet 12G. The metal film 11G extends to side surfaces of the magnetic ceramic sintered sheet 12G and to end portions of a second main surface 102G. The shield plate 10G is fixed on the surface of the metal frame 71 opposite the surface which abuts on the first main surface 701. The shield plate 10G is attached to the metal frame 71 with a bonding layer 15G interposed therebetween such that the second main surface 102G opposes the first main surface 701 of the printed wiring board 70. In this case, the portions of the metal film 11G extending to the second main surface 102G abut on the bonding layer 15G. It is preferable that the bonding layer 15G is a conductive layer and is provided in the same or substantially the same frame shape as the metal frame 71. The bonding layer 15G may preferably be a conductive bonding member, such as a solder, for example.

In the shield plate 10G configured as described above, the magnetic ceramic sintered sheet 12G defines and functions as a magnetic shield layer, while the metal film 11G defines and functions as a metal shield layer. Plural slits SL in the magnetic ceramic sintered sheet 12G are able to the flexibility. That is, advantages similar to those of the sixth preferred embodiment are obtained.

Ninth Preferred Embodiment

Figure 11:
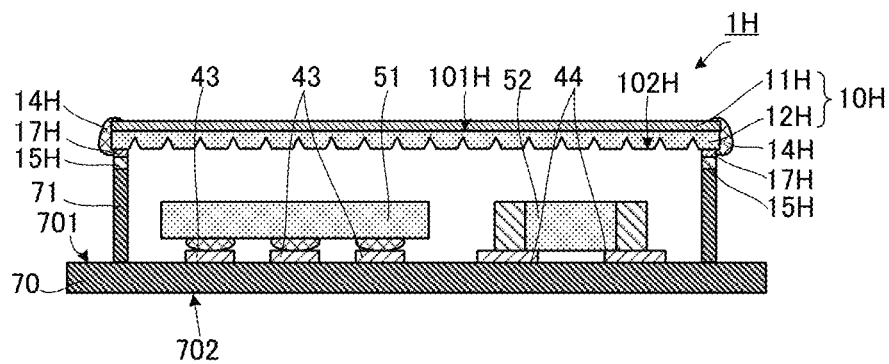
FIG. 11 is a side sectional view illustrating the configuration of an electronic component with a shield plate according to a ninth preferred embodiment of the present invention.

An electronic component with a shield plate according to a ninth preferred embodiment of the present invention will be described below with reference to the drawing. FIG. 11 is a side sectional view illustrating the configuration of the electronic component according to the ninth preferred embodiment of the present invention.

As shown in FIG. 11, an electronic component 1H with a shield plate according to the ninth preferred embodiment is different from the electronic component 1E according to the sixth preferred embodiment in that a solder 14H is provided and the shape of a shield plate 10H of an electronic component is different. The configurations of the other elements of the electronic component 1H are preferably the same as or similar to those of the electronic component 1E and will not be explained. A metal film 11H corresponds to the metal film 11E of the sixth preferred embodiment of the present invention. A magnetic ceramic sintered sheet 12H corresponds to the magnetic ceramic sintered sheet 12E of the sixth preferred embodiment of the present invention.

The shield plate 10H includes a metal film 17H instead of the via-conductor 16E provided in the shield plate 10E. The metal film 17H is provided only at each end portion of a second main surface 102H. The shield plate 10H is fixed on the surface of the metal frame 71 opposite the surface which abuts on the first main surface 701. The shield plate 10H is disposed such that the second main surface 102H opposes the first main surface 701 of the printed wiring board 70. In this case, the shield plate 10H is preferably attached to the metal frame 71 with a bonding layer 15H interposed therebetween, and the metal film 17H is connected to the metal frame 71 with the bonding layer 15H interposed therebetween. The metal film 11H and the metal film 17H are electrically connected to each other by the solder 14H extending to the side surfaces of the magnetic ceramic sintered sheet 12H. It is preferable that the bonding layer 15H is a conductive layer and is provided in the same or substantially the same frame shape as the metal frame 71. The bonding layer 15H may preferably be a conductive bonding member, such as a solder, for example.

In the shield plate 10H configured as described above, the magnetic ceramic sintered sheet 12H defines and functions as a magnetic shield layer, while the metal film 11H defines and functions as a metal shield layer. Plural slits SL in the magnetic ceramic sintered sheet 12H are able to improve the flexibility. That is, advantages similar to those of the sixth preferred embodiment are obtained.

Tenth Preferred Embodiment

Figure 12:
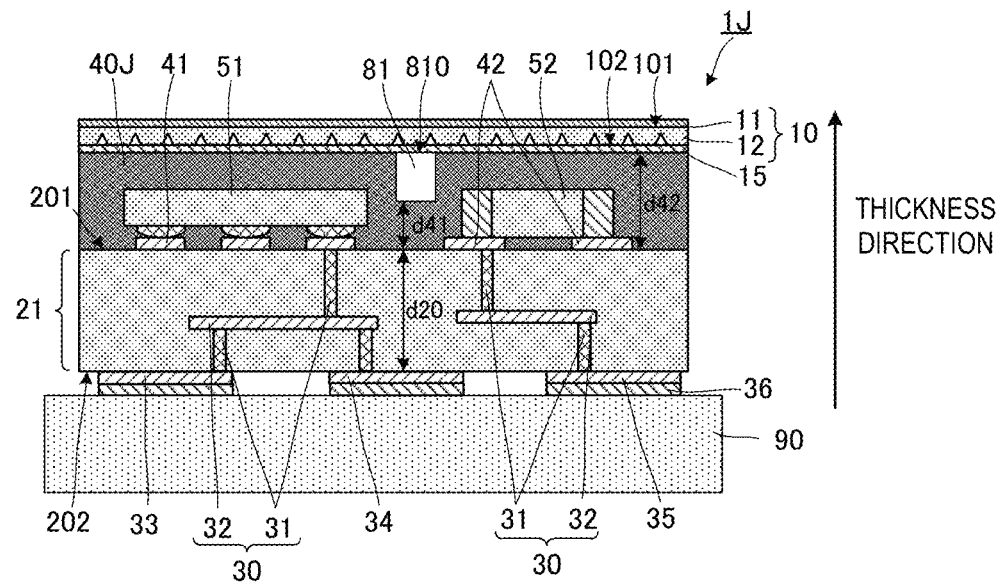
FIG. 12 is a side sectional view illustrating the configuration of an electronic component with a shield plate according to a tenth preferred embodiment of the present invention.

An electronic component with a shield plate according to a tenth preferred embodiment of the present invention will be described below with reference to the drawing. FIG. 12 is a side sectional view illustrating the configuration of the electronic component according to the tenth preferred embodiment of the present invention.

As shown in FIG. 12, an electronic component 1J with a shield plate according to the tenth preferred embodiment is different from the electronic component 1 according to the first preferred embodiment in that it includes an LTCC substrate 21 and that a cavity 81 is provided in a sealing resin 40J. The configurations of the other elements of the electronic component 1J are preferably the same as or similar to those of the electronic component 1 and will not be explained. For the sake of easy representation, in FIG. 12, some reference numerals are not shown and the dimensional relationships among the elements are changed appropriately.

The present preferred embodiment will be described by replacing the printed wiring board 20 in the first preferred embodiment by the LTCC substrate 21. The shape and the circuit pattern of the LTCC substrate 21 are the same as or similar to those of the printed wiring board 20 in the first preferred embodiment.

In the present preferred embodiment, the LTCC substrate is mounted on a printed wiring board 90 with connecting conductors 36 interposed therebetween.

The cavity 81 is provided in the sealing resin 40J. The cavity 81 includes an opening 810 on the side (top surface) of the sealing resin 40J which abuts on the shield plate 10, and is provided between the surface-mount electronic devices 51 and 52.

It is assumed that the thickness of the sealing resin 40J is d42 and the thickness of the LTCC substrate 21 is d20. The total thickness (d20+d42) of the thickness d42 and the thickness d20 is the entire thickness.

It is also assumed that the thickness of the sealing resin above which the cavity 81 is provided is d41 (d41 is smaller than d42). A portion where the cavity 81 is provided having a total thickness (d20+d41) of the thickness d20 and the thickness d41 is a thinner portion.

When heat is applied to the electronic component 1J, the electronic component 1J is thermally expanded, and, because of the difference in the coefficient of linear expansion among the elements, a stress is produced due to a warpage, for example. A stress is also applied to a bonding portion between the electronic component 1J and the printed wiring board 90. It is however possible to concentrate a stress on the thinner portion provided with the cavity 81. This relaxes a stress produced on the side surfaces of the electronic component 1J and a stress at the bonding portion between the electronic component 1J and the printed wiring board 90. That is, it is possible to reduce damage caused by a stress produced on the side surfaces of the electronic component 1J and a breakage at the bonding portion between the electronic component 1J and the printed wiring board 90.

Additionally, as discussed above, the cavity 81 is provided between the surface-mount electronic devices 51 and 52. This relaxes a stress applied to the surface-mount electronic devices 51 and 52 and accordingly reduces a break, for example. The performance of the electronic component 1J is thus able to be maintained.

In the shield plate 10 configured as described above, the magnetic ceramic sintered sheet 12 defines and functions as a magnetic shield layer while the metal film 11 defines and functions as a metal shield layer. Plural slits SL in the magnetic ceramic sintered sheet 12 are able to improve the flexibility. That is, advantages similar to those of the first preferred embodiment are obtained.

While maintaining the performance of the electronic component 1J, the advantage of reducing cracks is able to be obtained as a result of relaxing a stress due to the provision of the cavity 81. The cavity 81 is preferably provided at or substantially at the center of the electronic component 1J.

The ratio of the thickness d41 to the thickness d42 is not restricted to a particular value as long as the thickness d41 is smaller than the thickness d42.

Eleventh Preferred Embodiment

Figure 13:
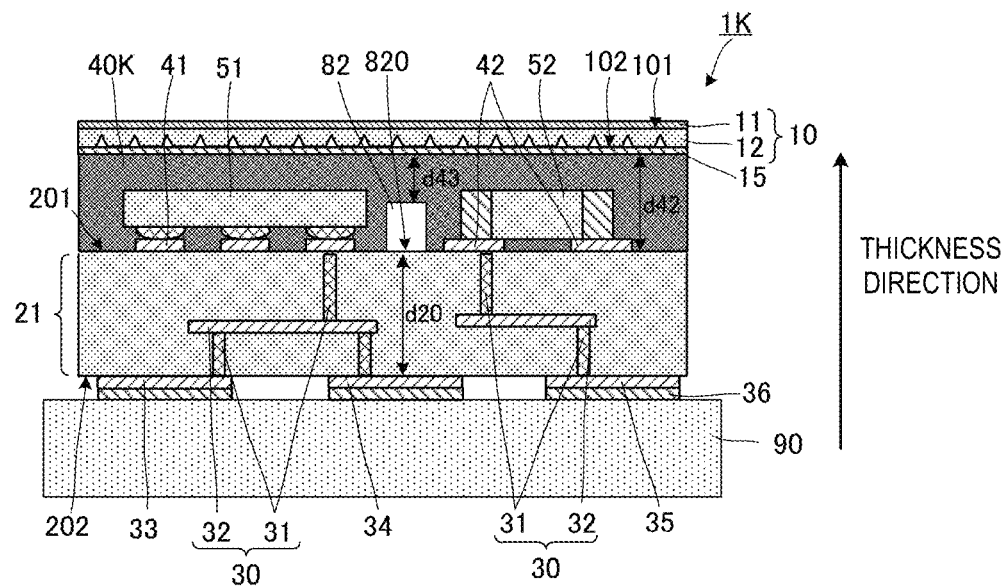
FIG. 13 is a side sectional view illustrating the configuration of an electronic component with a shield plate according to an eleventh preferred embodiment of the present invention.

An electronic component with a shield plate according to an eleventh preferred embodiment of the present invention will be described below with reference to the drawing. FIG. 13 is a side sectional view illustrating the configuration of the electronic component according to the eleventh preferred embodiment of the present invention.

As shown in FIG. 13, an electronic component 1K with a shield plate according to the eleventh preferred embodiment is different from the electronic component 1 according to the first preferred embodiment in that it includes an LTCC substrate 21 and that a cavity 82 is provided in a sealing resin 40K. The configurations of the other elements of the electronic component 1K are preferably the same as or similar to those of the electronic component 1 and will not be explained. For the sake of easy representation, in FIG. 13, some reference numerals are not shown and the dimensional relationships among the elements are changed appropriately.

The present preferred embodiment will be described by replacing the printed wiring board 20 in the first preferred embodiment by the LTCC substrate 21. The shape and the circuit pattern of the LTCC substrate 21 are preferably the same as or similar to those of the printed wiring board 20 in the first preferred embodiment.

In the present preferred embodiment, the LTCC substrate is mounted on a printed wiring board 90 with connecting conductors 36 interposed therebetween.

The cavity 82 is provided in the sealing resin 40K. The cavity 82 includes an opening 820 on the side (bottom surface) of the sealing resin 40K which abuts on the LTCC substrate 21, that is, on the first main surface 201 of the LTCC substrate 21, and is provided between the surface-mount electronic devices 51 and 52.

It is assumed that the thickness of the sealing resin 40K is d42 and the thickness of the LTCC substrate 21 is d20. The total thickness (d20+d42) of the thickness d42 and the thickness d20 is the entire thickness.

It is also assumed that the thickness of the sealing resin under which the cavity 82 is provided is d43 (d43 is smaller than d42). A portion where the cavity 82 is provided having a total thickness (d20+d43) of the thickness d20 and the thickness d43 is a thinner portion.

When heat is applied to the electronic component 1K, the electronic component 1K is thermally expanded, and, because of the difference in the coefficient of linear expansion among the elements, a stress is produced due to a warpage, for example. A stress is also applied to a bonding portion between the electronic component 1K and the printed wiring board 90. It is however possible to concentrate a stress on the thinner portion provided with the cavity 82. This relaxes a stress produced on the side surfaces of the electronic component 1K and a stress at the bonding portion between the electronic component 1K and the printed wiring board 90. That is, it is possible to reduce damage caused by a stress produced on the side surfaces of the electronic component 1K and a breakage at the bonding portion between the electronic component 1K and the printed wiring board 90.

Additionally, as discussed above, the cavity 82 is provided between the surface-mount electronic devices 51 and 52. This relaxes a stress applied to the surface-mount electronic devices 51 and 52 and accordingly reduces a break, for example. The performance of the electronic component 1K is thus able to be maintained.

In the shield plate 10 configured as described above, the magnetic ceramic sintered sheet 12 defines and functions as a magnetic shield layer, while the metal film 11 defines and functions as a metal shield layer. Plural slits SL in the magnetic ceramic sintered sheet 12 are able to improve the flexibility. That is, advantages similar to those of the first preferred embodiment are obtained.

While maintaining the performance of the electronic component 1K, the advantage of reducing cracks is able to be obtained as a result of relaxing a stress due to the provision of the cavity 82. The cavity 82 is preferably at or substantially at the center of the electronic component 1K.

The ratio of the thickness d43 to the thickness d42 is not restricted to a particular value as long as the thickness d43 is smaller than the thickness d42.

Twelfth Preferred Embodiment

Figure 14:
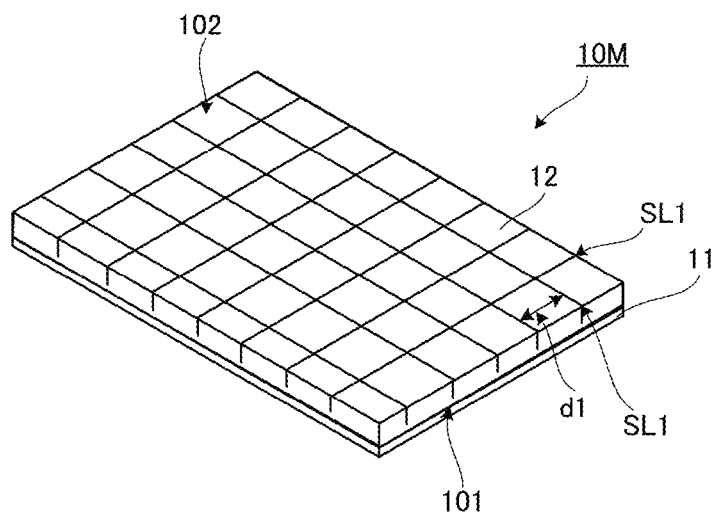
FIG. 14 is an external perspective view of a shield plate of an electronic component according to a twelfth preferred embodiment of the present invention, as viewed from the side of a second main surface.

An electronic component with a shield plate according to a twelfth preferred embodiment of the present invention will be described below with reference to the drawing. FIG. 14 is an external perspective view of the shield plate according to the twelfth preferred embodiment of the present invention, as viewed from the side of a second main surface.

As shown in FIG. 14, a shield plate 10M of an electronic component according to the twelfth preferred embodiment is different from the shield plate 10 according to the first preferred embodiment in that the distance between plural slits is wider than that of the slits SL in the first preferred embodiment. The configurations of the other elements of the shield plate 10M are preferably the same as or similar to those of the shield plate of the electronic component 1 and will not be explained. For the sake of easy representation, in FIG. 14, some reference numerals are not shown and the dimensional relationships among the elements are changed appropriately.

Slits SL1 are preferably provided in a lattice shape in a plan view of the second main surface 102 of the magnetic ceramic sintered sheet 12. It is assumed that the distance between the slits SL1 is d1, as shown in FIG. 14.

The slits SL1 are provided such that the distance d1 is wider than the distance d between the slits SL in the first preferred embodiment.

With this configuration, providing the plural slits SL1 improves the flexibility compared with an electronic component without slits. Providing the slits SL1 with a wider distance achieves the advantage of maintaining the strength of an electronic component 1M with the shield plate. The surface-mount electronic devices 51 and 52 overlap the slits SL1 less frequently as viewed from above, thus making it less likely to apply a stress to the surface-mount electronic devices 51 and 52.

Thirteenth Preferred Embodiment

Figure 15:
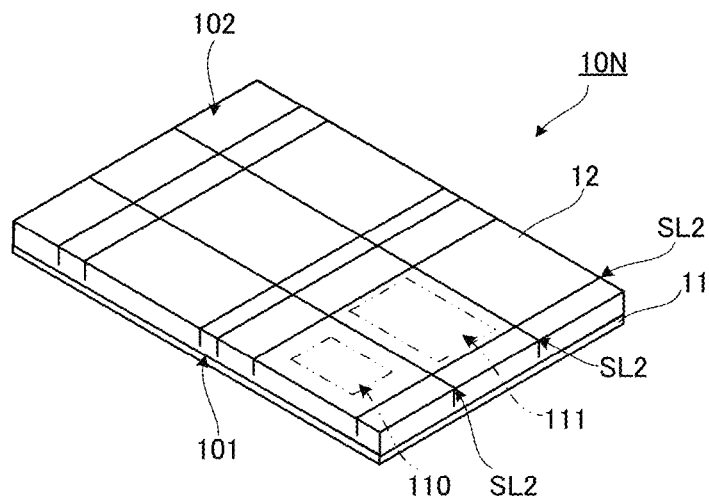
FIG. 15 is an external perspective view of a shield plate of an electronic component according to a thirteenth preferred embodiment of the present invention, as viewed from the side of a second main surface 102.

An electronic component with a shield plate according to a thirteenth preferred embodiment of the present invention will be described below with reference to the drawing. FIG. 15 is an external perspective view of the shield plate according to the thirteenth preferred embodiment of the present invention, as viewed from the side of a second main surface 102.

As shown in FIG. 15, a shield plate 10N of an electronic component according to the thirteenth preferred embodiment is different from the shield plate 10 according to the first preferred embodiment in that the shape of a portion between plural slits differs from that between the plural slits SL. The configurations of the other elements of the shield plate 10N are preferably the same as or similar to those of the shield plate 10 and will not be explained. For the sake of easy representation, in FIG. 15, some reference numerals are not shown and the dimensional relationships among the elements are changed appropriately.

On the second main surface 102 of the shield plate 10N, positions at which devices are disposed are set. In the present preferred embodiment, device positions 110 and 111 are set.

The surface-mount electronic device 51, which is not shown, is disposed at a position at which it matches the device position 110 as viewed from above. The surface-mount electronic device 52, which is not shown, is disposed at a position at which it matches the device position 111 as viewed from above. The surface-mount electronic device 51 is a first surface mount device, while the surface-mount electronic device 52 is a second surface mount device.

In the magnetic ceramic sintered sheet 12, plural slits SL2 are provided to avoid the device positions 110 and 111. The slits SL2 are provided from the second main surface 102 toward the first main surface 101 of the magnetic ceramic sintered sheet 12. The slits SL2 are provided in a predetermined pattern in a plan view of the second main surface 102 of the magnetic ceramic sintered sheet 12.

A slit SL2 is provided between the device positions 110 and 111. That is, the slit SL2 is provided between the surface-mount electronic devices 51 and 52.

Providing the plural slits SL2 in the magnetic ceramic sintered sheet 12 improves the flexibility. Additionally, providing a slit SL2 between the surface-mount electronic devices 51 and 52 reduces the possibility that the magnetic ceramic sintered sheet 12 bends at positions at which the surface-mount electronic devices 51 and 52 are disposed.

In the present preferred embodiment, the provision of two surface-mount electronic devices has been discussed. However, mounting plural surface-mount electronic devices at positions at which the slits SL2 are not provided may also obtain similar advantages.

Fourteenth Preferred Embodiment

Figure 16:
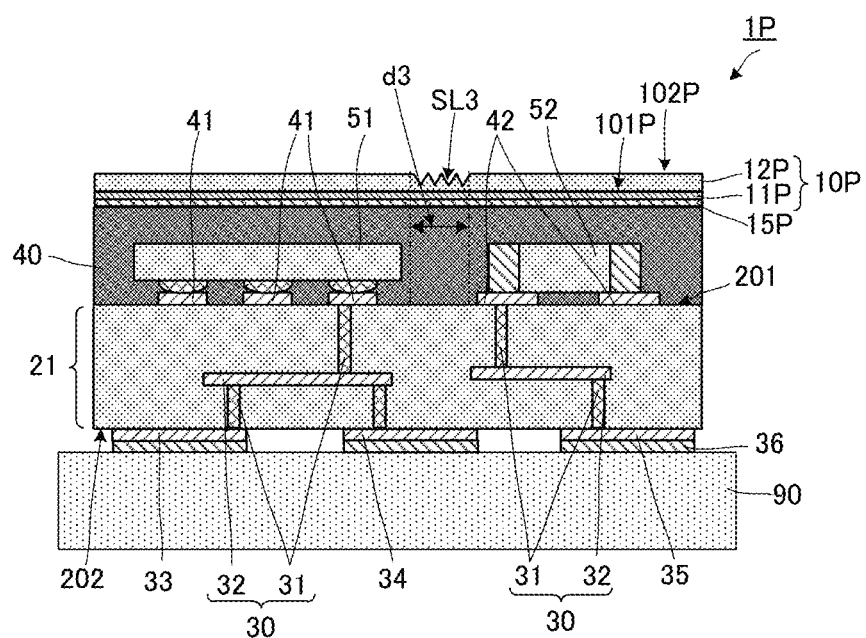
FIG. 16 is a side sectional view illustrating the configuration of an electronic component with a shield plate according to a fourteenth preferred embodiment of the present invention.

An electronic component with a shield plate according to a fourteenth preferred embodiment of the present invention will be described below with reference to the drawing. FIG. 16 is a side sectional view illustrating the configuration of the electronic component according to the fourteenth preferred embodiment of the present invention.

As shown in FIG. 16, an electronic component 1P with a shield plate according to the fourteenth preferred embodiment is different from the electronic component 1 according to the first preferred embodiment in that it includes an LTCC substrate 21 and that the shape of a magnetic ceramic sintered sheet 12P of a shield plate 10P is different. The configurations of the other elements of the electronic component 1P are preferably the same as or similar to those of the electronic component 1 and will not be explained. For the sake of easy representation, in FIG. 16, some reference numerals are not shown and the dimensional relationships among the elements are changed appropriately.

The present preferred embodiment will be described by replacing the printed wiring board 20 in the first preferred embodiment by the LTCC substrate 21. The shape and the circuit pattern of the LTCC substrate 21 are similar to those of the printed wiring board 20 in the first preferred embodiment.

In the present preferred embodiment, the LTCC substrate is mounted on a printed wiring board 90 with connecting conductors 36 interposed therebetween.

The shield plate 10P includes a metal film 11P and the magnetic ceramic sintered sheet 12P. The configurations of the other elements of the electronic component 1P are the same as or similar to those of the electronic component 1 and will not be explained. The metal film 11P corresponds to the metal film 11 of the first preferred embodiment of the present invention. The magnetic ceramic sintered sheet 12P corresponds to the magnetic ceramic sintered sheet 12 of the first preferred embodiment of the present invention.

As shown in FIG. 16, the shield plate 10P is fixed on the surface (top surface) of the sealing resin 40 opposite the surface which abuts on the LTCC substrate 21. The shield plate 10P is attached to the sealing resin 40 such that a first main surface 101P opposes the sealing resin 40. In other words, the shield plate 10P including the magnetic ceramic sintered sheet 12P provided in a shape different from the magnetic ceramic sintered sheet 12 of the shield plate 10 shown in FIGS. 2A and 2B is attached to the sealing resin 40 with a bonding layer 15P interposed therebetween.

The shield plate 10P includes the metal film 11P and the magnetic ceramic sintered sheet 12P. The metal film 11P corresponds to the "first metal film". The metal film 11P is provided on the first main surface 101P of the magnetic ceramic sintered sheet 12P. On a second main surface 102P of the magnetic ceramic sintered sheet 12P, plural slits SL3 are provided.

In a plan view, when seeing the electronic component 1P from the top surface, that is, from the first main surface 201, one end of a group of the plural slits SL3 does not overlap an end of the surface-mount electronic device 51. In a plan view, when seeing the electronic component 1P from the top surface, that is, from the first main surface 201, the other end of the group of the plural slits SL3 does not overlap an end of the surface-mount electronic device 52. The surface-mount electronic device 51 is the first surface mount device of the present invention, while the surface-mount electronic device 52 is the second surface mount device of the present invention.

In other words, in a plan view, a total width d3 of the area where the plural slits SL3 are provided is smaller than the distance between the surface-mount electronic devices 51 and 52. The slits SL3 are preferably disposed between an electrode used in mounting the surface-mount electronic device 51 and that for mounting the surface-mount electronic device 52.

In the shield plate 10P configured as described above, the magnetic ceramic sintered sheet 12P defines and functions as a magnetic shield layer and is able to mainly block low-frequency noise with high efficiency. The metal film 11P defines and functions as a metal shield layer and is able to mainly block high-frequency noise with high efficiency.

The plural slits SL3 are provided only between the surface-mount electronic devices 51 and 52 and are not provided in the other portions, thus making it less likely to reduce the strength of the electronic component 1P.

The portion provided with the slits SL3 defines and functions as a thinner portion, thus relaxing a stress applied to the surface-mount electronic devices 51 and 52 and a stress to the side surfaces of the electronic component 1P.

Fifteenth Preferred Embodiment

Figure 17:
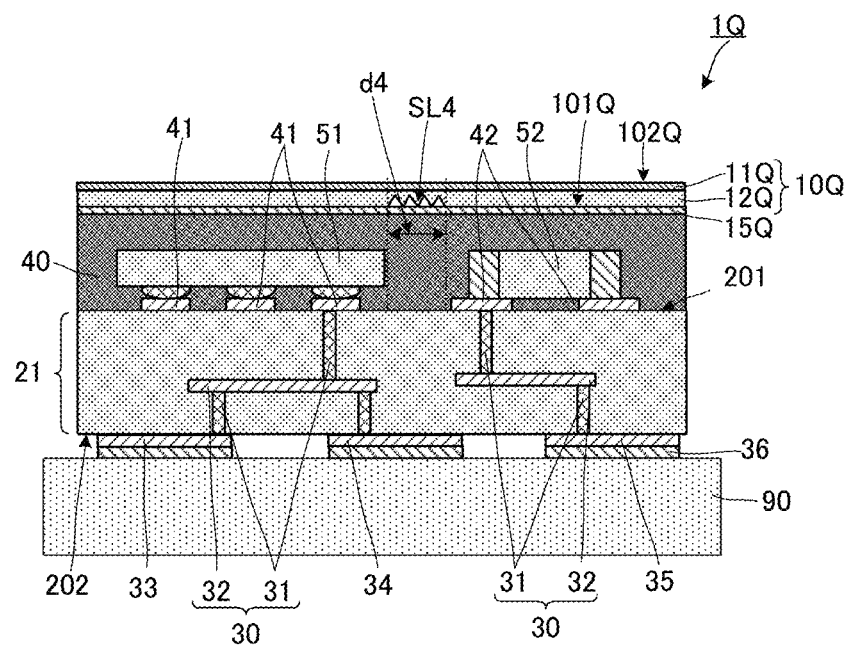
FIG. 17 is a side sectional view illustrating the configuration of an electronic component with a shield plate according to a fifteenth preferred embodiment of the present invention.

An electronic component with a shield plate according to a fifteenth preferred embodiment of the present invention will be described below with reference to the drawing. FIG. 17 is a side sectional view illustrating the configuration of the electronic component according to the fifteenth preferred embodiment of the present invention.

As shown in FIG. 17, an electronic component 1Q with a shield plate according to the fifteenth preferred embodiment is different from the electronic component 1 according to the first preferred embodiment in that it includes an LTCC substrate 21 and that the shape of a magnetic ceramic sintered sheet 12Q of a shield plate 10Q is different. The shield plate 10Q includes a metal film 11Q and the magnetic ceramic sintered sheet 12Q. The configurations of the other elements of the electronic component 1Q are preferably the same as or similar to those of the electronic component 1 and will not be explained. The metal film 11Q corresponds to the metal film 11 of the first preferred embodiment of the present invention. The magnetic ceramic sintered sheet 12Q corresponds to the magnetic ceramic sintered sheet 12 of the first preferred embodiment of the present invention.

The present preferred embodiment will be described by replacing the printed wiring board 20 in the first preferred embodiment by the LTCC substrate 21. The shape and the circuit pattern of the LTCC substrate 21 are similar to those of the printed wiring board 20 in the first preferred embodiment.

In the present preferred embodiment, the LTCC substrate is mounted on a printed wiring board 90 with connecting conductors 36 interposed therebetween.

As shown in FIG. 17, the shield plate 10Q is fixed on the surface of the sealing resin 40 opposite the surface which abuts on the LTCC substrate 21. The shield plate 10Q is fixed on the side adjacent to the top surface of the sealing resin 40. The shield plate 10Q is attached to the sealing resin 40 such that a first main surface 101Q opposes the sealing resin 40. In other words, the shield plate 10Q including the magnetic ceramic sintered sheet 12Q provided in a shape different from the magnetic ceramic sintered sheet 12 of the shield plate 10 shown in FIGS. 2A and 2B is attached to the sealing resin 40 with a bonding layer 15Q interposed therebetween.

The shield plate 10Q includes the metal film 11Q and the magnetic ceramic sintered sheet 12Q. The metal film 11Q corresponds to the "first metal film". The metal film 11Q is provided on the second main surface 101Q of the magnetic ceramic sintered sheet 12Q. On a second main surface 102Q of the magnetic ceramic sintered sheet 12Q, plural slits SL4 are provided.

In a plan view, when seeing the electronic component 1Q from the top surface, that is, from the first main surface 201, one end of a group of the plural slits SL4 does not overlap an end of the surface-mount electronic device 51. In a plan view, when seeing the electronic component 1Q from the top surface, that is, from the first main surface 201, the other end of the group of the plural slits SL4 does not overlap an end of the surface-mount electronic device 52. The surface-mount electronic device 51 is the first surface mount device of the present invention, while the surface-mount electronic device 52 is the second surface mount device of the present invention.

In other words, in a plan view, a total width d4 of the area where the plural slits SL4 are provided is smaller than the distance between the surface-mount electronic devices 51 and 52. The slits SL4 are preferably disposed between an electrode used in mounting the surface-mount electronic device 51 and those used in mounting the surface-mount electronic device 52.

In the shield plate 10Q configured as described above, the magnetic ceramic sintered sheet 12Q defines and functions as a magnetic shield layer and is able to mainly block low-frequency noise with high efficiency. The metal film 11Q defines and functions as a metal shield layer and is able to mainly block high-frequency noise with high efficiency.

The plural slits SL4 are provided only between the surface-mount electronic devices 51 and 52 and are not provided in the other portions, thus making it less likely to reduce the strength of the electronic component 1Q.

The portion provided with the slits SL4 defines and functions as a thinner portion, thus relaxing a stress applied to the surface-mount electronic devices 51 and 52 and a stress to the side surfaces of the electronic component 1Q.

The metal film 11Q covers the electronic component 1Q from above, like a lid, thus making the electronic component 1Q flat. This reduces limitations in selecting products on which the electronic component 1Q will be mounted.

Sixteenth Preferred Embodiment

Figure 18A:
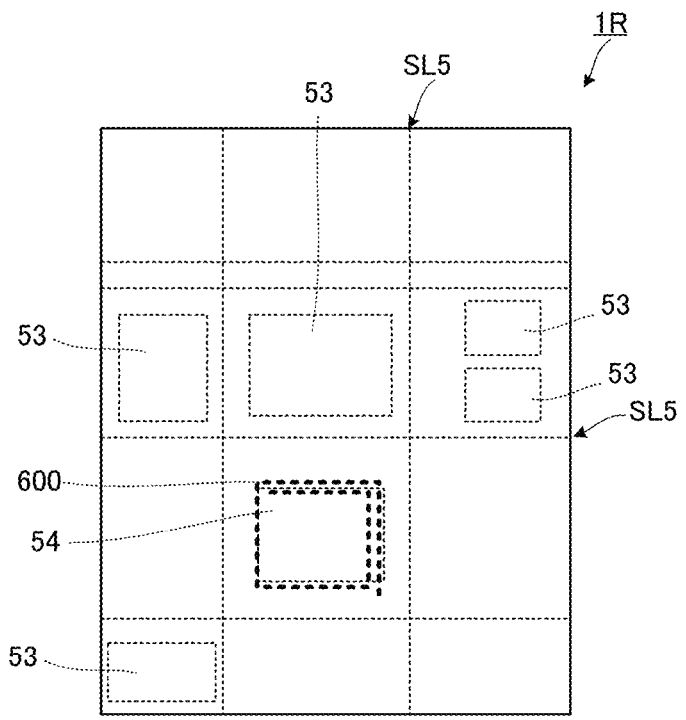
FIG. 18A is a schematic front view of an electronic component with a shield plate according to a sixteenth preferred embodiment of the present invention, as viewed from a first main surface.
Figure 18B:
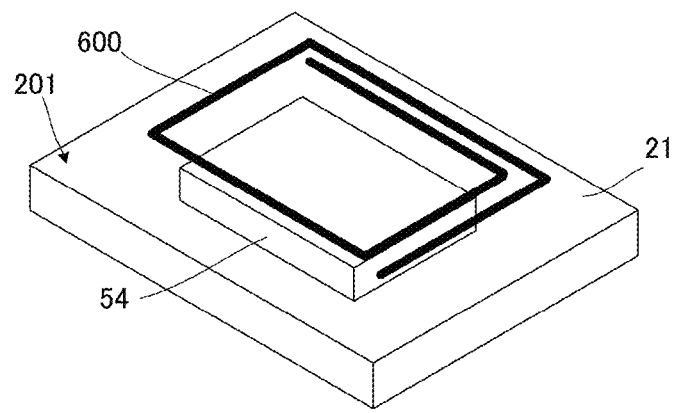
FIG. 18B is an enlarged perspective view of a portion on which a coil is disposed.
Figure 19:
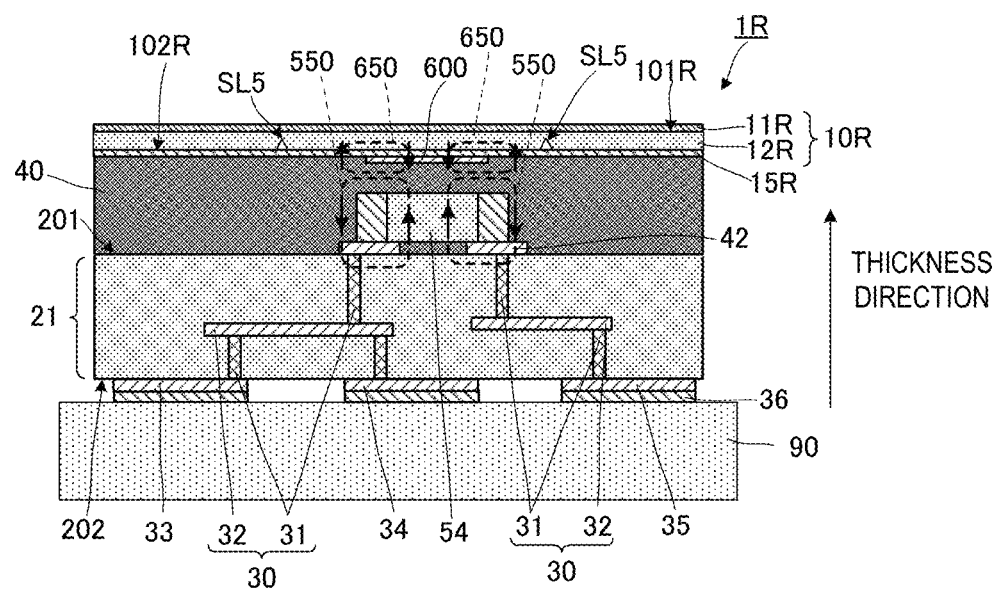
FIG. 19 is a schematic side view illustrating the configuration of the electronic component according to the sixteenth preferred embodiment of the present invention.

An electronic component with a shield plate according to a sixteenth preferred embodiment of the present invention will be described below with reference to the drawings. FIG. 18A is a schematic front view of the electronic component according to the sixteenth preferred embodiment of the present invention, as viewed from a first main surface. FIG. 18B is an enlarged perspective view of a portion of an LTCC substrate 21 on which a coil is disposed. FIG. 19 is a schematic side view illustrating the configuration of the electronic component according to the sixteenth preferred embodiment of the present invention.

As shown in FIG. 19, an electronic component 1R with a shield plate according to the sixteenth preferred embodiment is different from the electronic component 1 according to the first preferred embodiment in that it includes an LTCC substrate 21, a coil is disposed on the side adjacent to the top surface (closer to the first main surface 201), and the shape of a magnetic ceramic sintered sheet 12R of a shield plate 10R is different. The shield plate 10R includes a metal film 11R and the magnetic ceramic sintered sheet 12R. The configurations of the other elements of the electronic component 1R are preferably the same as or similar to those of the electronic component 1 and will not be explained. The metal film 11R corresponds to the metal film 11 of the first preferred embodiment of the present invention. The magnetic ceramic sintered sheet 12R corresponds to the magnetic ceramic sintered sheet 12 of the first preferred embodiment of the present invention.

The present preferred embodiment will be described by replacing the printed wiring board 20 in the first preferred embodiment by the LTCC substrate 21. The shape and the circuit pattern of the LTCC substrate 21 are the same as or similar to those of the printed wiring board 20 in the first preferred embodiment.

In the present preferred embodiment, the LTCC substrate is mounted on a printed wiring board 90 with connecting conductors 36 interposed therebetween.

As shown in FIG. 18A, when viewing the electronic component 1R from the first main surface 201, plural surface-mount electronic devices 53 and 54 are mounted, and plural slits SL5 are provided at portions where the surface-mount electronic devices 53 and 54 are not mounted. The surface-mount electronic device 54 is preferably an inductor, for example, including an inductor conductor 500. For example, in a plan view of the first main surface 201, the inductor conductor 500 is provided in a shape in which it is wound around a winding axis positioned in the thickness direction.

As shown in FIG. 18B, an inductor conductor 600 is provided on the side adjacent to the top surface of the surface-mount electronic device 54. The inductor conductor 600 is a linear conductor provided in a spiral shape in which it is wound around a winding axis positioned in the thickness direction, in a plane parallel with the first main surface 201. The inductor conductor 600 defines an inductor. The inductor conductor 600 may be connected to the metal film 11R or ground terminal conductors 33 and 34 on the LTCC substrate 21 via metal pins.

More specifically, as shown in FIG. 19, the surface-mount electronic device 54 is mounted on land conductors 42 used in mounting components. The sealing resin 40 is provided on the first main surface 201 of the LTCC substrate 21. The sealing resin 40 covers the first main surface 201 of the LTCC substrate 21 and the surface-mount electronic device 54.

The shield plate 10R is fixed on the surface (top surface) of the sealing resin 40 opposite the surface which abuts on the LTCC substrate 21. The shield plate 10R is disposed on the side adjacent to the top surface of the sealing resin 40. The shield plate 10R is attached to the sealing resin 40 such that a second main surface 102R opposes the sealing resin 40. In other words, the shield plate 10R including the magnetic ceramic sintered sheet 12R provided in a shape different from the magnetic ceramic sintered sheet 12 of the shield plate 10 shown in FIGS. 2A and 2B is attached to the front surface of the sealing resin 40 with a bonding layer 15R interposed therebetween. The bonding layer 15R is an insulating layer.

As a result of causing a current to flow through the inductor conductor 500, a first magnetic flux 550 is generated.

A second magnetic flux 650 is generated from the inductor conductor 600. To make the first magnetic flux 550 and the second magnetic flux 650 attenuate each other in the thickness direction, the inductor conductor 500 (surface-mount electronic device 54) and the inductor conductor 600 are disposed at positions at which the opening of the inductor conductor 500 and that of the inductor conductor 600 overlap each other in a plan view of the shield plate 10R as viewed from the top surface.

If the range by which the opening of the inductor conductor 500 and that of the inductor conductor 600 overlap each other is increased, the effect of reducing the magnetic flux leakage is improved.

In the present preferred embodiment, the inductor conductor 500 is used as the surface-mount electronic device 54. However, instead of an inductor conductor, any electronic device which generates magnetic flux in the thickness direction may produce similar advantages.

The plural slits SL5 are provided in the shield plate 10R, that is, on a second main surface 102R of the magnetic ceramic sintered sheet 12R. In a plan view, when seeing the electronic component 1R from the top surface, that is, from the first main surface 201, the plural slits SL5 do not overlap the surface-mount electronic device 54. In a plan view, when seeing the electronic component 1R from the top surface, that is, from the first main surface 201, the end portions of the plural slits SL5 do not overlap the end portions of the surface-mount electronic device 54. The surface-mount electronic device 54 is the first surface mount device.

In the shield plate 10R configured as described above, the magnetic ceramic sintered sheet 12R defines and functions as a magnetic shield layer and is able to mainly block low-frequency noise with high efficiency. The metal film 11R defines and functions as a metal shield layer and is able to mainly block high-frequency noise with high efficiency.

In a plan view, when seeing the electronic component 1R from the top surface, that is, from the first main surface 201, the plural slits SL5 are provided only at positions at which they do not overlap the surface-mount electronic device 54, and are not provided in the other portions, thus making it less likely to reduce the strength of the electronic component 1R.

The portions provided with the slits SL5 define and function as thinner portions, thus relaxing a stress applied to the surface-mount electronic device 54 and a stress to the side surfaces of the electronic component 1R.

In the above-described preferred embodiments, the printed wiring boards are used. However, the use of magnetic substrates also achieves the above-described advantages.

In the above-described preferred embodiments, a conductive bonding layer is used. If, however, it is not necessary to connect the shield plate to a ground, an insulating bonding layer may be used. A bonding layer having adhesiveness on both sides, such as double-sided tape, may alternatively be used.

In the above-described preferred embodiments, a conductive bonding layer is used. If, however, it is not necessary to connect the shield plate to a ground, an insulating bonding layer may be used. A bonding layer having adhesiveness on both sides, such as double-sided tape, may alternatively be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component with a shield plate, comprising:
    a wiring substrate;
    a surface mount device mounted on a front surface of the wiring substrate; and
    a shield plate fixed on a side adjacent to a top surface of the surface mount device; wherein
    the shield plate includes:
        a magnetic ceramic sintered sheet having first and second main surfaces;
        a first metal film disposed on the first main surface of the magnetic ceramic sintered sheet; and
        a plurality of slits provided on at least one of the first and second main surfaces of the magnetic ceramic sintered sheet and extending into only a portion in a thickness direction of the magnetic ceramic sintered sheet.

2. The electronic component according to claim 1, wherein the plurality of slits are provided on the second main surface of the magnetic ceramic sintered sheet.

3. The electronic component according to claim 1, wherein the first metal film is a metal thin film.

4. The electronic component according to claim 3, wherein
    the first metal film is disposed on the first main surface; and
    a second metal film is disposed on the second main surface.

5. The electronic component according to claim 4, wherein the second metal film is a metal thin film.

6. The electronic component according to claim 1, wherein the first main surface of the magnetic ceramic sintered sheet opposes the surface mount device.

7. The electronic component according to claim 6, wherein a conductor that connects the first metal film and a surface electrode on the wiring substrate is provided.

8. The electronic component according to claim 1, wherein a sealing resin is provided on the front surface of the wiring substrate, and the shield plate is fixed on a side adjacent to a top surface of the sealing resin.

9. The electronic component according to claim 1, wherein a via-electrode that passes through the magnetic ceramic sintered sheet is provided, one end of the via-electrode being exposed on the first main surface, another end of the via-electrode being exposed on the second main surface.

10. The electronic component according to claim 1, wherein:
    the surface mount device includes first and second surface mount devices mounted adjacent to each other on the wiring substrate;
    a sealing resin is provided to cover the first and second surface mount devices;
    the sealing resin includes a cavity; and
    an area of the sealing resin where the cavity is provided defines a thinner portion, the thinner portion having a smaller thickness than an area of the sealing resin where the first and second surface mount devices are disposed.

11. The electronic component according to claim 10, wherein the cavity is opened on a top surface or a bottom surface of the sealing resin.

12. The electronic component according to claim 10, wherein, when seeing one main surface of the wiring substrate from one main surface of the first metal film in a plan view, the thinner portion is between the first and second surface mount devices.

13. The electronic component according to claim 1, wherein
the surface mount device includes first and second surface mount devices mounted adjacent to each other on the wiring substrate;
when seeing one main surface of the wiring substrate from one main surface of the first metal film in a plan view, a plurality of slits are between the first and second surface mount devices; and
an area where the plurality of slits are provided defines a thinner portion, the thinner portion having a smaller thickness than an area where the first and second surface mount devices are disposed.

14. The electronic component according to claim 10, wherein
an inductor conductor is provided on a side adjacent to a top surface of the first surface mount device;
the surface mount device generates a first magnetic flux;
the inductor conductor generates a second magnetic flux;
when seeing one main surface of the wiring substrate from one main surface of the first metal film in a plan view, the inductor conductor is disposed at a position at which at least a portion of an opening of the inductor conductor overlaps the first surface mount device so that the inductor conductor opposes the first surface mount device; and
the inductor conductor is wound in a direction in which the second magnetic flux generated from the inductor conductor and the first magnetic flux generated from the first surface mount device attenuate each other.

15. The electronic component according to claim 1, further comprising a bonding layer interposed between the wiring substrate and the shield plate.

16. The electronic component according to claim 1, wherein the wiring substrate is made of a glass epoxy substrate.

17. The electronic component according to claim 9, wherein
the surface mount device includes first and second surface mount devices mounted adjacent to each other on the wiring substrate;
a sealing resin is provided to cover the first and second surface mount devices; and
a via-hole conductor is embedded within the sealing resin.

18. An electronic component with a shield plate, comprising:
a wiring substrate;
a surface mount device mounted on a front surface of the wiring substrate; and
a shield plate including a magnetic ceramic sintered sheet and fixed on a side adjacent to a top surface of the surface mount device; wherein
a plurality of slits are provided a main surface of the magnetic ceramic sintered sheet and extend into only a portion in a thickness direction of the magnetic ceramic sintered sheet; and
a metal film is disposed on the main surface of the magnetic ceramic sintered sheet on which the plurality of slits are provided.

19. A shield plate of an electronic component, comprising:
a magnetic ceramic sintered sheet including first and second main surfaces;
a metal film disposed on at least one of the first and second main surfaces of the magnetic ceramic sintered sheet; and
a plurality of slits provided on at least one of the first and second main surfaces of the magnetic ceramic sintered sheet and extending into only a portion in a thickness direction of the magnetic ceramic sintered sheet.

20. The shield plate of claim 19, wherein the metal film is defined by a metal thin film having a total thickness of about 25 µm to about 50 µm.

* * * * *